US012713805B2

(12) United States Patent
Kim et al.

(10) Patent No.: US 12,713,805 B2
(45) Date of Patent: Aug. 18, 2026

(54) DISPLAY PANEL AND ELECTRONIC APPARATUS INCLUDING THE SAME

(71) Applicant: Samsung Display Co., Ltd., Yongin-si (KR)

(72) Inventors: Sang Gyun Kim, Yongin-si (KR); Hyomin Ko, Yongin-si (KR); Ilha Song, Yongin-si (KR); Ilsoo Oh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 437 days.

(21) Appl. No.: 18/365,663

(22) Filed: Aug. 4, 2023

(65) Prior Publication Data

US 2024/0138225 A1 Apr. 25, 2024
US 2024/0237466 A9 Jul. 11, 2024

(30) Foreign Application Priority Data

Oct. 21, 2022 (KR) ........................ 10-2022-0136231
Feb. 17, 2023 (KR) ........................ 10-2023-0021235

(51) Int. Cl.
*H10K 59/38* (2023.01)
*G02B 27/01* (2006.01)
*H10K 59/122* (2023.01)
*H10K 102/00* (2023.01)

(52) U.S. Cl.
CPC ......... *H10K 59/38* (2023.02); *G02B 27/0172* (2013.01); *H10K 59/122* (2023.02); *H10K 2102/351* (2023.02)

(58) Field of Classification Search
CPC ................. H10K 59/38; H10K 59/122; H10K 2102/351; G02B 27/0172
USPC .......................................................... 313/500
See application file for complete search history.

(56) References Cited

U.S. PATENT DOCUMENTS 7,803,469 B2 9/2010 Lee et al.
8,288,784 B2 10/2012 Cho
10,510,975 B2 12/2019 Kim et al.
10,573,840 B2 2/2020 Lee et al.
10,707,284 B2 * 7/2020 Lv ....................... H10K 59/179
(Continued)

FOREIGN PATENT DOCUMENTS

KR 10-1058109 B1 8/2011
KR 10-2019-0079268 A 7/2019
(Continued)

*Primary Examiner* — Joseph L Williams
*Assistant Examiner* — Hana S Featherly
(74) *Attorney, Agent, or Firm* — Womble Bond Dickinson (US) LLP

(57) ABSTRACT

Provided is a display panel including a circuit layer and a display element layer above the circuit layer. The display element layer may include a first light-emitting element, a second light-emitting element, and a pixel-defining film that are spaced apart in a direction perpendicular to the thickness direction. The first light-emitting element may include an optical auxiliary layer and a conductive layer sequentially stacked between the first electrode and the hole transport region, and the second light-emitting element may omit the optical auxiliary layer and the conductive layer. The optical auxiliary layer may be spaced apart from the hole transport region with the conductive layer interposed therebetween.

19 Claims, 12 Drawing Sheets

(56) References Cited

U.S. PATENT DOCUMENTS 11,081,676 B2 8/2021 Kim et al.
11,522,028 B2 12/2022 Lim et al.
2019/0165295 A1* 5/2019 Toyoda .................. H10K 50/15
2019/0198816 A1* 6/2019 Park ..................... H10K 59/123
2021/0296592 A1* 9/2021 Kim ..................... C07D 403/10
2022/0165979 A1 5/2022 Huang

FOREIGN PATENT DOCUMENTS

KR 10-2021-0008240 A 1/2021
KR 10-2021-0017179 A 2/2021

* cited by examiner

FP
MF
LS1
LS2
LS
DP
CF
ED
DR1
DR2
DR3

DP
OC
TFE
P_OH
PDL
DP-ED
DP-CL
BS
CF1
CF2
CF3
CFL
NPXA
PXA-1
PXA-2
PXA-3
XX'
ZZ'
CPL
EL1-1 OAL CDL EP EL2
ED-1
PDL_EG2
PDL_EG1
EL1-2 EP EL2
ED-2
EL1-3 EP EL2
ED-3
I
I'
DR3

FIG. 9

DISPLAY PANEL AND ELECTRONIC APPARATUS INCLUDING THE SAME

CROSS-REFERENCE TO RELATED APPLICATIONS

This application claims priority to, and the benefit of, Korean Patent Application No. 10-2022-0136231, filed on Oct. 21, 2022, and Korean Patent Application No. 10-2023-0021235, filled on Feb. 17, 2023, in the Korean Intellectual Property Office, the entire contents of which are hereby incorporated by reference.

BACKGROUND

1. Field

The present disclosure herein relates to a display panel including a plurality of light-emitting layers and an electronic apparatus including the same.

2. Description of the Related Art

Various types of electronic apparatuses that can be worn on a body are being developed, and these apparatuses are generally referred to as a wearable electronic apparatus. The wearable electronic apparatus may have various forms that can be detachably attached to a part of a human body or clothing. As an example of the wearable electronic apparatus, there is a device that can be mounted on a user's head, and such a device can be called, for example, a head-mounted device (HMD). As a device, such as an HMD is located at a relatively short distance from a user, a solution may be suitable to eliminate a screen door effect (SDE) in which a line that distinguishes pixels is visually recognized by the user.

SUMMARY

The present disclosure provides a display panel having improved display efficiency and display lifetime, and an electronic apparatus including the same.

One or more embodiments of the present disclosure provide a display panel including a circuit layer, and a display element layer above the circuit layer, and including a first light-emitting element, a second light-emitting element, and a pixel-defining film arranged in a direction perpendicular to a thickness direction, the first light-emitting element and the second light-emitting element including a first electrode, a hole transport region above the first electrode, a first light-emitting layer above the hole transport region, and configured to generate a first light, a second light-emitting layer above the first light-emitting layer, and configured to generate a second light that is different from the first light, a third light-emitting layer above the second light-emitting layer, and configured to generate a third light that is different from the first light and the second light, an electron transport region above the third light-emitting layer, a second electrode above the electron transport region, a first light-emitting auxiliary portion between the first light-emitting layer and the second light-emitting layer, and a second light-emitting auxiliary portion between the second light-emitting layer and the third light-emitting layer, wherein the first light-emitting element includes an optical auxiliary layer and a conductive layer sequentially stacked between the first electrode and the hole transport region, wherein the second light-emitting element omits the optical auxiliary layer and the conductive layer, and wherein the optical auxiliary layer is spaced from a portion of the hole transport region in the direction perpendicular to the thickness direction with the conductive layer interposed therebetween.

The optical auxiliary layer may include a lower surface, a first side surface inclined with respect to the lower surface, and an upper surface spaced apart from the lower surface in the thickness direction.

The hole transport region may have a first width in a direction perpendicular to the first side surface of the optical auxiliary layer, and a second width in the thickness direction that is greater than the first width.

The first light-emitting auxiliary portion may have a third width in a direction perpendicular to the first side surface of the optical auxiliary layer, and a fourth width in the thickness direction that is greater than the third width.

The second light-emitting auxiliary portion may have a fifth width in a direction perpendicular to the first side surface of the optical auxiliary layer, and a sixth width in the thickness direction that is greater than the fifth width.

The optical auxiliary layer may include a region covering a side surface of the first electrode, wherein the region does not overlap the conductive layer.

The optical auxiliary layer may include at least one of silicon oxide, silicon oxynitride, or silicon nitride.

The conductive layer may cover the optical auxiliary layer, and may contact an upper surface of the first electrode.

The conductive layer may contact a side surface of the first electrode.

A first thickness of the first light-emitting auxiliary portion may be about 500 Å to about 2500 Å, and a second thickness of the second light-emitting auxiliary portion may be about 500 Å to about 2500 Å.

A first distance from the first electrode to the first light-emitting layer in the thickness direction may be about 2000 Å or less.

A second distance from the third light-emitting layer to the second electrode in the thickness direction may be about 600 Å or less.

A first one of the first light, the second light, and the third light may have an m-th-order resonance, and a second one of the first light, the second light, and the third light may have an m+a-th-order resonance, "m" being an integer of 2 to 5, and "a" being an integer of 1 to 4.

The pixel-defining film may be spaced from the first electrode in the direction perpendicular to the thickness direction, and may include a same material as the optical auxiliary layer.

The hole transport region may contact the circuit layer at a portion that does not overlap the first electrode and the pixel-defining film.

The display panel may further include a color filter layer above the display element layer, and including a first filter corresponding to the first light-emitting element, and a second filter corresponding to the second light-emitting element, wherein the first filter includes a green colorant or a blue colorant, and the second filter includes a red colorant, or wherein the first filter includes the red colorant, and the second filter includes the green colorant or the blue colorant.

The first light may include red light, wherein the second light includes blue light, and wherein the third light includes green light.

The first light may include green light, wherein a first one of the second light and the third light includes red light, and wherein a second one of the second light and the third light includes blue light.

The first light may include blue light, wherein a first one of the second light and the third light includes red light, and wherein the a second one of the second light and the third light includes green light.

In one or more embodiments of the present disclosure, an electronic apparatus includes a display panel, and a lens unit opposite to the display panel, wherein the display panel includes a circuit layer, and a display element layer above the circuit layer, and including a first light-emitting element, a second light-emitting element, and a pixel-defining film arranged in a direction perpendicular to a thickness direction, wherein the first light-emitting element and the second light-emitting element include a first electrode, a hole transport region above the first electrode, a first light-emitting layer above the hole transport region, and configured to generate a first light, a second light-emitting layer above the first light-emitting layer, and configured to generate a second light different from the first light, a third light-emitting layer above the second light-emitting layer, and configured to generate a third light different from the first light and the second light, a second electrode above the third light-emitting layer, a first light-emitting auxiliary portion between the first light-emitting layer and the second light-emitting layer, and a second light-emitting auxiliary portion between the second light-emitting layer and the third light-emitting layer, wherein the first light-emitting element includes an optical auxiliary layer and a conductive layer sequentially stacked between the first electrode and the hole transport region, wherein the second light-emitting element omits the optical auxiliary layer and the conductive layer, and wherein the optical auxiliary layer is spaced from the hole transport region in the direction perpendicular to the thickness direction with the conductive layer interposed therebetween.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain aspects of the present disclosure. In the drawings:

FIG. 9 is a cross-sectional view of the display panel according to one or more embodiments of the present disclosure;

DETAILED DESCRIPTION

Figure 1:
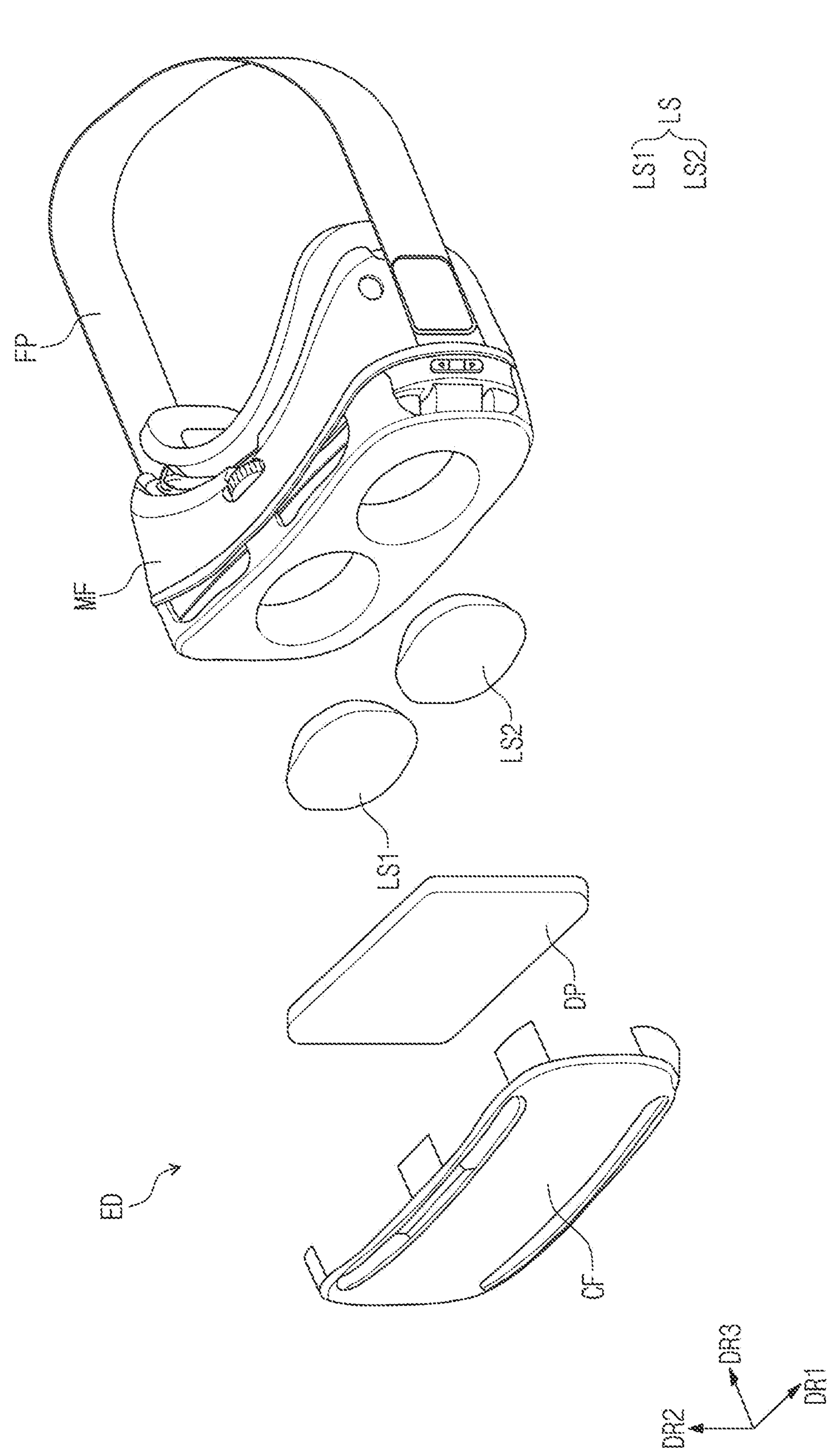
FIG. 1 is an exploded perspective view illustrating an electronic apparatus according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Further, each of the features of the various embodiments of the present disclosure may be combined or combined with each other, in part or in whole, and technically various interlocking and driving are possible. Each embodiment may be implemented independently of each other or may be implemented together in an association. The described embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" and "at least one of A or B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a display panel and an electronic apparatus including the display panel according to one or more embodiments of the present disclosure will be described with reference to the drawings.

FIG. 1 is a perspective view illustrating an electronic apparatus ED according to one or more embodiments of the present disclosure. The electronic apparatus ED may be activated according to an electrical signal. For example, the electronic apparatus ED may be a television, a monitor, an external billboard, a game machine, a personal computer, a notebook computer, a mobile phone, a tablet, a navigation system, and a wearable device, but the present disclosure is not limited thereto.

FIG. 1 illustrates a head mounted display (HMD) device as an example of an electronic apparatus ED. A head-mounted display device may be mounted on a user's head to provide a screen on which an image or video is displayed to the user. The head-mounted display device may include a see-through type that provides augmented reality (AR) based on actual external objects and a see-closed type that provides virtual reality (VR) to a user with a screen independent of external objects.

Referring to FIG. 1, the electronic apparatus ED may include a display panel DP and a lens unit LS opposite to the display panel DP. In addition, the electronic apparatus ED may include a main frame MF, a cover frame CF, and a fixing part FP.

The main frame MF may be worn on a user's face. The main frame MF may have a shape corresponding to the shape of the user's head (face). For example, the length of the fixing part FP may be adjusted according to the circumference of the user's head. The fixing part FP may be a structure for facilitating the mounting of the main frame MF, and may include a strap, band, or the like. However, the present disclosure is not limited thereto, and the fixing part FP may have various shapes, such as a helmet or a pair of eyeglass temples coupled to the main frame MF.

The lens unit LS, the display panel DP, and the cover frame CF may be mounted on the main frame MF. The main frame MF may include a space or structure in which the lens unit LS and the display panel DP may be accommodated.

The lens unit LS may be located between the display panel DP and a user. Light emitted from the display panel DP may pass through the lens unit LS to be provided to the user. For example, the lens unit LS may include various types of lenses, such as a multi-channel lens, a convex lens, a concave lens, a spherical lens, an aspheric lens, a single lens, a compound lens, a standard lens, a narrow-angle lens, a wide-angle lens, a fixed focus lens, and a variable focus lens.

The lens unit LS may include a first lens LS1 and a second lens LS2. The first lens LS1 and the second lens LS2 may be located to correspond to the positions of a user's left and right eyes. The first lens LS1 and the second lens LS2 may be accommodated inside the main frame MF.

The display panel DP may be provided to the main frame MF in a fixed state or in a detachable state. By including an optical auxiliary layer OAL (see FIG. 4A), the display panel DP according to one or more embodiments of the present disclosure may exhibit excellent characteristics in display efficiency and display lifetime. The display panel DP will be described in more detail later.

The cover frame CF may be located on one surface of the display panel DP to protect the display panel DP. The cover frame CF and the lens unit LS may be spaced apart from each other with the display panel DP interposed therebetween.

FIG. 1 and the following drawings illustrate first to third direction axes DR1 to DR3, and directions indicated by the first to third direction axes DR1, DR2, and DR3 described herein are relative concepts, and may be converted into other directions. In addition, the directions indicated by the first to third direction axes DR1, DR2, and DR3 may be described as first to third directions for which the same reference numerals may be used. In this specification, the first direction axis DR1 and the second direction axis DR2 are orthogonal to each other, and the third direction axis DR3 may be normal to a plane defined by the first direction axis DR1 and the second direction axis DR2.

The thickness direction of the electronic apparatus ED may be parallel to the third direction axis DR3, which is a normal direction of a plane defined by the first and second direction axes DR1 and DR2. In this specification, the front surface (or upper surface) and the rear surface (or lower surface) of the members constituting the electronic apparatus ED may be defined with respect to the third direction axis DR3. In this specification, the plane in the expression "on a plane" means a plane that is parallel to the plane defined by the first and second direction axes DR1 and DR2, and the cross section in the expression "on a cross section" means a cross section that is parallel to the third direction axis DR3.

Figure 2A:
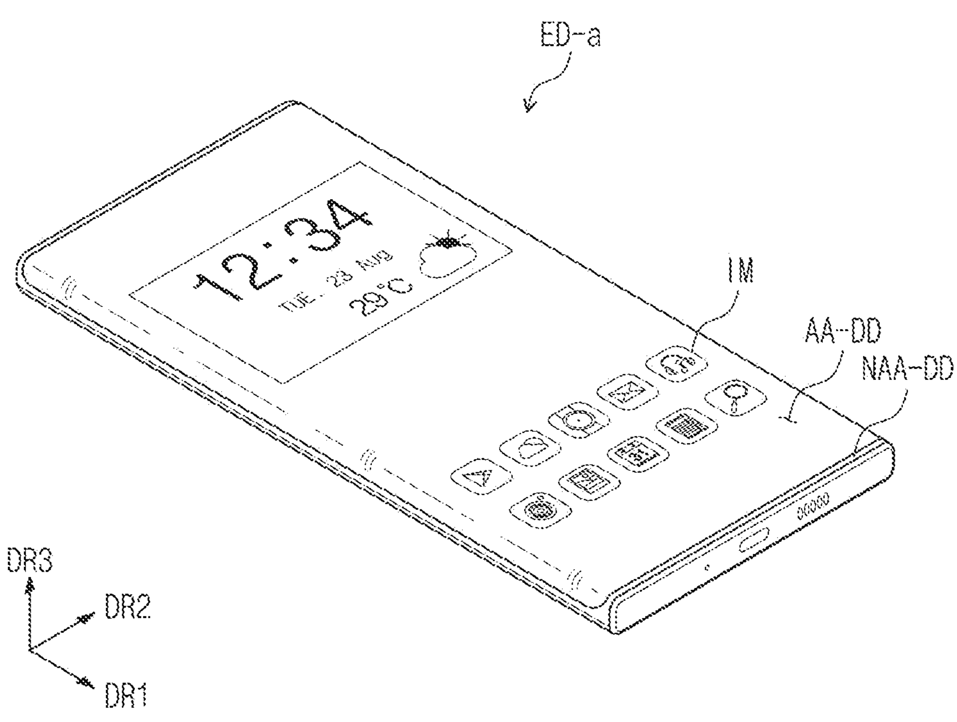
FIG. 2A is a perspective view illustrating an electronic apparatus according to one or more embodiments of the present disclosure.

FIG. 2A is a perspective view illustrating an electronic apparatus according to one or more other embodiments of the present disclosure and illustrates a mobile phone as an example of an electronic apparatus ED-a. The electronic apparatus ED-a may display an image IM through an active region AA-DD. The active region AA-DD may include a plane defined by the first direction axis DR1 and the second direction axis DR2. The active region AA-DD may include a curved surface bent from at least one side of the plane defined by the first and second direction axes DR1 and DR2. However, this is only an example, and the shape of the active region AA-DD is not limited thereto. For example, the active region AA-DD may include only the plane, and the active region AA-DD may further include at least two curved surfaces of the plane, for example, four curved surfaces respectively bent from four side surfaces thereof.

The peripheral region NAA-DD is adjacent to the active region AA-DD. The peripheral region NAA-DD may surround the active region AA-DD. Accordingly, the shape of the active region AA-DD may be substantially defined by the peripheral region NAA-DD. However, this is illustrated as an example, and the peripheral region NAA-DD may be located adjacent to only one side of the active region AA-DD, or may be omitted. The active region AA-DD may be provided in various shapes, and is not limited to any one embodiment.

Figure 2B:
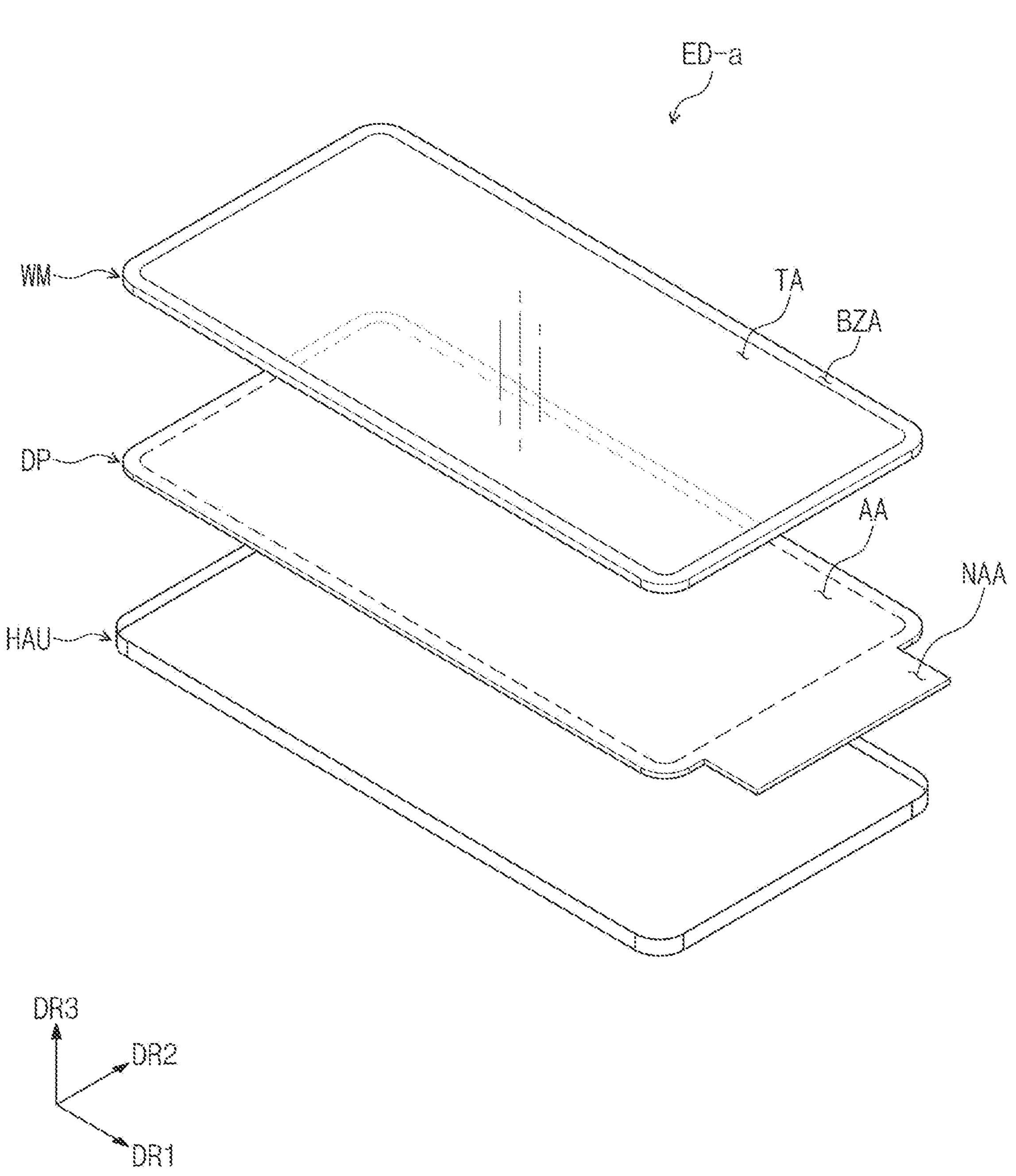
FIG. 2B is an exploded perspective view of the electronic apparatus illustrated in FIG. 2A.

FIG. 2B is an exploded perspective view of the electronic apparatus ED-a illustrated in FIG. 2A. Referring to FIG. 2B, the electronic apparatus ED-a may include a housing HAU, a display panel DP, and a window member WM.

The window member WM may cover the entire outer side of the display panel DP. The window member WM may include a transmission region TA and a bezel region BZA. The front surface of the window member WM including the transmission region TA and the bezel region BZA may correspond to the front surface of the electronic apparatus ED-a. The transmission region TA may correspond to the active region AA-DD of the electronic apparatus ED-a illustrated in FIG. 2A, and the bezel region BZA may correspond to the peripheral region NAA-DD of the electronic apparatus ED-a illustrated in FIG. 2A.

The transmission region TA may be an optically transparent region. The bezel region BZA may have a relatively lower light transmittance than the transmission region TA. The bezel region BZA may have a color (e.g., predetermined color). The bezel region BZA may be adjacent to, and may surround, the transmission region TA. The bezel region BZA may define the shape of the transmission region TA. However, the present disclosure is not limited to what is illustrated, and the bezel region BZA may be located adjacent to only one side of the transmission region TA, or a portion of the bezel region BZA may be omitted.

A display region AA and a non-display region NAA may be defined in the display panel DP. The display region AA may correspond to the active region AA-DD of the electronic device ED-a illustrated in FIG. 2A, and the non-display region NAA may correspond to the peripheral region NAA-DD of the electronic device ED-a illustrated in FIG. 2A.

A display region AA and a non-display region NAA may be defined in the display panel DP. The display region AA may correspond to the active region AA-DD of the electronic device ED-a illustrated in FIG. 2A, and the non-display region NAA may correspond to the peripheral region NAA-DD of the electronic device ED-a illustrated in FIG. 2A.

The display region AA may be activated according to an electrical signal. The non-display region NAA may be positioned adjacent to at least one side of the display region AA.

The non-display region NAA may be located to surround the display region AA. However, the present disclosure is not limited thereto, and unlike what is illustrated in FIG. 2B, a portion of the non-display region NAA may be omitted. A driving circuit or a driving line for driving the display region AA may be located in the non-display region NAA.

By including an optical auxiliary layer OAL (see FIG. 4A), the display panel DP according to one or more embodiments of the present disclosure may exhibit relatively excellent characteristics in display efficiency and display lifetime. The display panel DP will be described in more detail later.

In one or more embodiments, an input sensing unit may be provided on the display panel DP. The input sensing unit may sense an external input applied from the outside. The external input may be a user's input. The user's input may include various types of external inputs, such as a part of the user's body, light, heat, a pen, or pressure. For example, the input sensing unit may be located on (e.g., located above) an encapsulation layer TFE (see FIG. 4A) of the display panel DP, which will be described later. Alternatively, the input sensing unit may be located directly on the encapsulation layer TFE (see FIG. 4A), or may be located directly on an adhesive member located on the encapsulation layer TFE (see FIG. 4A). The adhesive member may include a conventional adhesive or a glue agent.

In this specification, when an element (or region, layer, section, etc.) is referred to as being "located directly" on another element, this means that no third element is located between the element and the other element. That is, when an element is "located directly" on another element, it means that the element comes in "contact" with the other element.

The housing HAU may accommodate the display panel DP and the like. The housing HAU may be coupled to the window member WM.

Figure 3:
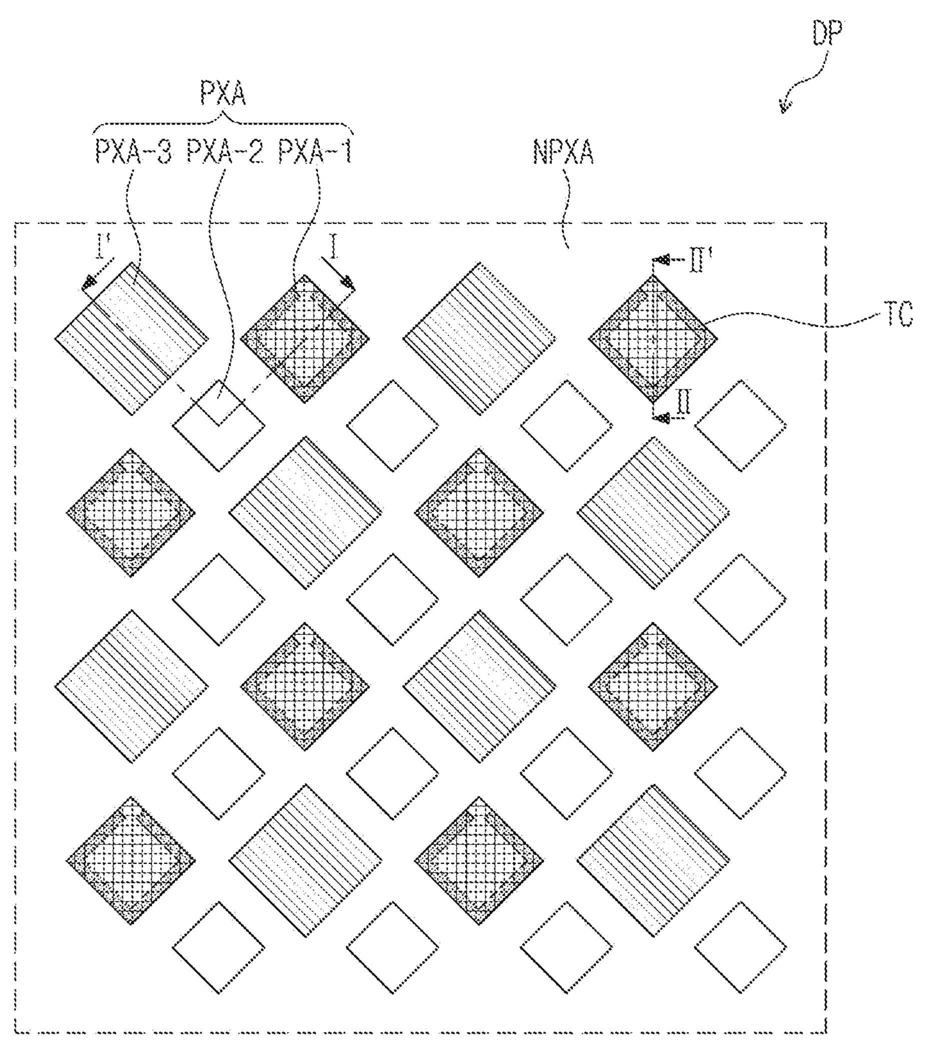
FIG. 3 is a plan view illustrating a display panel according to one or more embodiments of the present disclosure.
Figure 3:
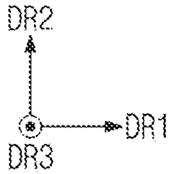

FIG. 3 is a plan view illustrating a display panel DP according to one or more embodiments of the present disclosure. Hereinafter, the description of the display panel DP may be equally applied to the display panel DP included in the electronic apparatuses ED and ED-a illustrated in FIGS. 1 and 2B.

Referring to FIG. 3, the display panel DP may include a light-emitting region PXA and a non-light-emitting region NPXA. The non-light-emitting region NPXA may surround the light-emitting region PXA. The light-emitting region PXA may be provided in plurality. The light-emitting region PXA may include a first light-emitting region PXA-1, a second light-emitting region PXA-2, and a third light-emitting region PXA-3. The first light-emitting region PXA-1, the second light-emitting region PXA-2, and the third light-emitting region PXA-3 may emit light of a respective wavelength range. The first light-emitting region PXA-1 may emit a first light, and the second light-emitting region PXA-2 may emit a second light that is different from the first light. The third light-emitting region PXA-3 may emit a third light that is different from the first light and the second light.

Among the first to third light-emitting regions PXA-1, PXA-2, and PXA-3, the area of the third light-emitting region PXA-3 may be the largest, and the area of the second light-emitting region PXA-2 may be the smallest. However, this is only an example, and the areas of the first to third light-emitting regions PXA-1, PXA-2, and PXA-3 are not limited thereto. FIG. 3 illustrates that the first light-emitting region PXA-1 and the third light-emitting region PXA-3 are alternately arranged in one row, and the second light-emitting region PXA-2 is spaced apart from the first light-emitting region PXA-1 and the third light-emitting region PXA-3 and arranged in another row. However, this is only an example, and the arrangement of the first to third light-emitting regions PXA-1, PXA-2, and PXA-3 is not limited thereto.

Figure 4A:
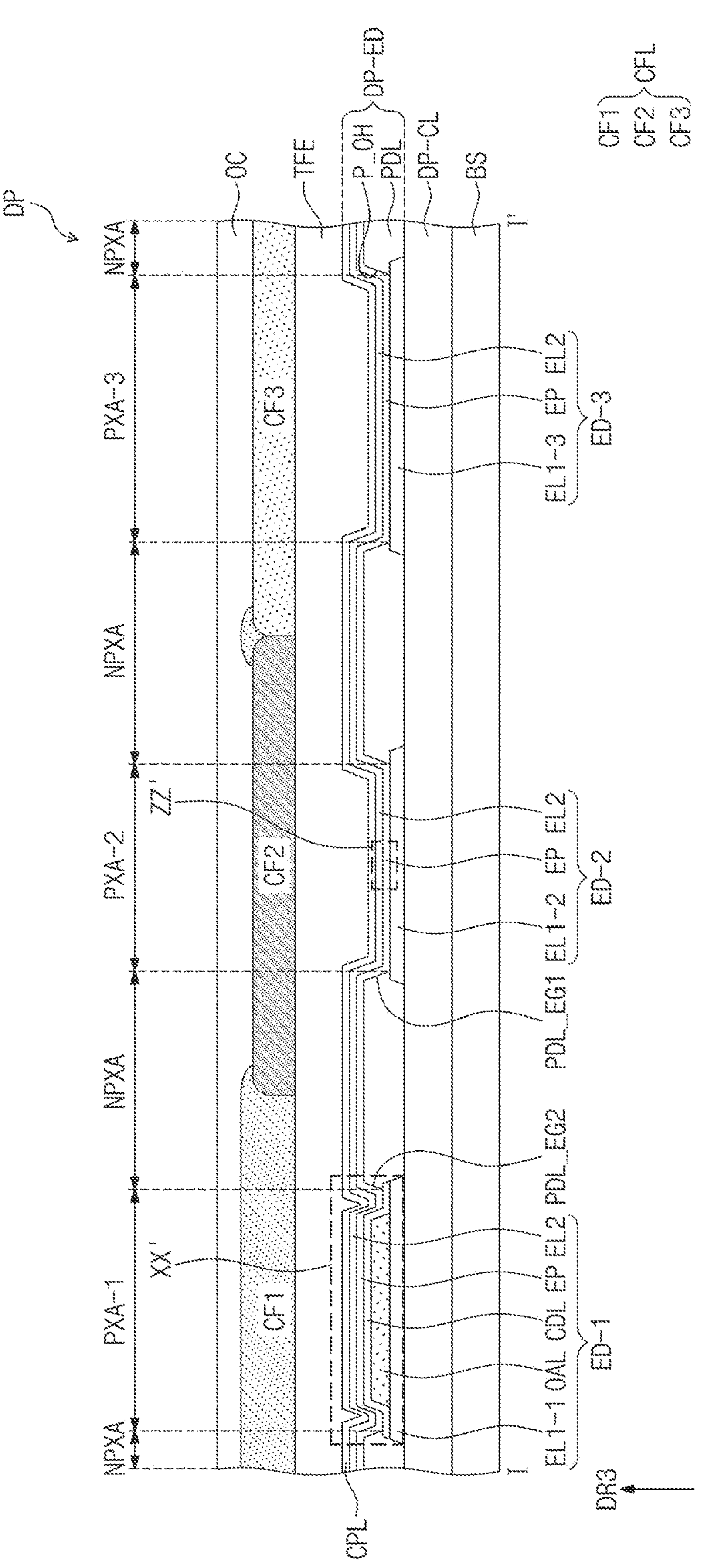
FIG. 4A is a cross-sectional view taken along the line I-I' of FIG. 3.

FIG. 4A is a cross-sectional view taken along the line I-I' of FIG. 3, and may be a cross-sectional view of a display panel DP according to one or more embodiments of the present disclosure. Referring to FIG. 4A, the display panel DP may include a base layer BS, a circuit layer DP-CL located on the base layer BS, a display element layer DP-ED located on the circuit layer DP-CL, and an encapsulation layer TFE located on the display element layer DP-ED. In addition, the display panel DP may further include a color filter layer CFL located on the encapsulation layer TFE.

The base layer BS may be a member configured to provide a base surface on which the circuit layer DP-CL is located. The base layer BS may be a rigid substrate or a flexible substrate capable of being bent, folded, or rolled. The base layer BS may be a glass substrate, a metal substrate, or a polymer substrate. However, the present disclosure is not limited thereto, and the base layer BS may be an inorganic layer, an organic layer, or a composite material layer.

The base layer BS may have a single-layered or multi-layered structure. For example, the base layer BS may include a first synthetic resin layer, a multi-layered or single-layered intermediate layer, and a second synthetic resin layer, which are sequentially stacked. The intermediate layer may be referred to as a base barrier layer. The intermediate layer may include a silicon oxide (SiOx) layer and an amorphous silicon (a-Si) layer located on the silicon oxide layer, but is not particularly limited thereto. For example, the intermediate layer may include at least one of a silicon oxide layer, a silicon nitride layer, a silicon oxynitride layer, or an amorphous silicon layer.

Each of the first and second synthetic resin layers may contain a polyimide-based resin. In addition, each of the first and second synthetic resin layers may contain at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In this specification, a "~~"-based resin means to include a functional group of "~~".

The circuit layer DP-CL may be located on the base layer BS. The circuit layer DP-CL may include an insulating layer, a semiconductor pattern, a conductive pattern, a signal line, and the like. An insulating layer, a semiconductor layer, and a conductive layer may be formed on the base layer BS by a method, such as coating and deposition, and then, the insulating layer, the semiconductor layer, and the conductive layer may be selectively patterned through a plurality of photolithography processes. Hereafter, the semiconductor pattern, the conductive pattern, and the signal line included in the circuit layer DP-CL may be formed.

The display element layer DP-ED may be located on the circuit layer DP-CL. The display element layer DP-ED may include first to third light-emitting elements ED-1, ED-2, and ED-3 and a pixel-defining film PDL. Referring to FIG. 4A, the first to third light-emitting elements ED-1, ED-2, and ED-3 may be spaced apart from each other in one direction perpendicular to the thickness direction DR3.

The first to third light-emitting elements ED-1, ED-2, and ED-3 may have a tandem structure. Each of the first to third light-emitting elements ED-1, ED-2, and ED-3 may include first electrodes EL1-1, EL1-2, and EL1-3, a light-emitting portion EP located on the first electrodes EL1-1, EL1-2, and EL1-3, and a second electrode EL2 located on the light-emitting portion EP. In addition, each of the first to third light-emitting elements ED-1, ED-2, and ED-3 may further include a capping layer CPL. The light-emitting portion EP may include at least a plurality of light-emitting layers EML-1, EML-2, and EML-3 (see FIGS. 4B and 4C). The light-emitting portion EP will be described in more detail later.

In the first to third light-emitting elements ED-1, ED-2, and ED-3 (see FIG. 4A), the light-emitting portion EP may be provided as a common layer. The light-emitting portion EP may overlap the first to third light-emitting regions PXA-1, PXA-2, and PXA-3 and the non-light-emitting region NPXA. In addition, in the first to third light-emitting elements ED-1, ED-2, and ED-3, the second electrode EL2 may be provided as a common electrode. In this specification, the expression "one element overlaps another element" is not limited to having a same area and a same shape on a plane and also includes having a different area and/or a different shape.

Referring to FIG. 4A, the first light-emitting element ED-1 may include an optical auxiliary layer OAL and a conductive layer CDL, which are located between the first electrode EL1-1 and the light-emitting portion EP. The second light-emitting element ED-2 may omit an optical auxiliary layer and a conductive layer. The third light-emitting element ED-3 may omit an optical auxiliary layer and a conductive layer. The optical auxiliary layer OAL may be located directly on the first electrode EL1-1. The conductive layer CDL may be located directly on, and may cover, the optical auxiliary layer OAL.

A pixel opening P_OH of the pixel-defining film PDL may expose at least a portion of the first electrodes EL1-1, EL1-2, and EL1-3. The first to third light-emitting regions PXA-1, PXA-2, and PXA-3 may be defined to correspond to the first electrodes EL1-1, EL1-2, and EL1-3 exposed by the respective pixel openings P_OH. The non-light-emitting region NPXA may correspond to the pixel-defining film PDL.

The pixel-defining film PDL may be spaced apart from the optical auxiliary layer OAL with the conductive layer CDL interposed therebetween. The pixel-defining film PDL may include one side edge PDL_EG2 and the other side edge PDL_EG1 spaced apart from each other in one direction perpendicular to the thickness direction DR3. The one side edge PDL_EG2 may be adjacent to the first light-emitting element ED-1 and located on the optical auxiliary layer OAL. The one side edge PDL_EG2 may be spaced apart from the first electrode EL1-1 of the first light-emitting element ED-1 with the optical auxiliary layer OAL interposed therebetween. The other side edge PDL_EG1 may be adjacent to the second light-emitting element ED-2, and may be located on the first electrode EL1-2 of the second light-emitting element ED-2.

The encapsulation layer TFE may be located on the display element layer DP-ED. The encapsulation layer TFE may protect the display element layer DP-ED from foreign substances, such as moisture, oxygen, and dust particles. The encapsulation layer TFE may include at least one inorganic film (hereinafter referred to as an encapsulation inorganic film). In addition, the encapsulation layer TFE may include at least one organic film (hereinafter referred to as an encapsulation organic film) and at least one encapsulation inorganic film.

The encapsulation inorganic film may protect the display element layer DP-ED from moisture/oxygen, and the encapsulation organic film may protect the display element layer DP-ED from foreign substances, such as dust particles. The encapsulation inorganic film may contain silicon nitride, silicon oxynitride, silicon oxide, titanium oxide, aluminum oxide, or the like, but is not particularly limited thereto. The encapsulation organic film may contain an acrylic-based compound, an epoxy-based compound, or the like. The encapsulating organic film may contain a photopolymerizable organic material, and is not particularly limited thereto.

A color filter layer CFL may be located on the encapsulation layer TFE. The color filter layer CFL may include a first filter CF1 corresponding to the first light-emitting region PXA-1, a second filter CF2 corresponding to the second light-emitting region PXA-2, and a third filter CF3 corresponding to the third light-emitting region PXA-3. In one or more embodiments, the color filter layer CFL may further include a light-blocking portion. The light-blocking portion may be a black matrix. The light-blocking portion may be formed to contain an organic light-blocking material or an inorganic light-blocking material, which includes a black pigment or a black dye. The light-blocking portion may reduce or prevent a light leakage phenomenon and demarcate boundaries between adjacent filters CF1, CF2, and CF3.

Each of the first to third filters CF1, CF2, and CF3 may contain a polymer photosensitive resin and a colorant. In this specification, the colorant includes a pigment and a dye. A red colorant includes a red pigment and a red dye, a green colorant includes a green pigment and a green dye, and a blue colorant includes a blue pigment and a blue dye.

In FIG. 4A, the first filter CF1 may contain a red pigment or a red dye, the second filter CF2 may contain a green pigment or a green dye, and the third filter CF3 may contain a blue pigment or a blue dye. That is, the first filter CF1 located on the first light-emitting element ED-1 including the optical auxiliary layer OAL may contain a red colorant. The second filter located on the second light-emitting element ED-2 excluding an optical auxiliary layer may contain a green colorant. The third filter located on the third light-emitting element ED-3 excluding an optical auxiliary layer may contain a blue colorant. Unlike this, the first filter CF1 located on the first light-emitting element ED-1 including the optical auxiliary layer OAL may contain a green colorant, the second filter located on the second light-emitting element ED-2 excluding an optical auxiliary layer may contain a red colorant, and the third filter located on the third light-emitting element ED-3 excluding an optical auxiliary layer may contain a blue colorant.

An overcoat layer OC may be located on the color filter layer CFL. The overcoat layer OC may be optically transparent. The overcoat layer OC may include a flat upper surface.

Figure 4B:
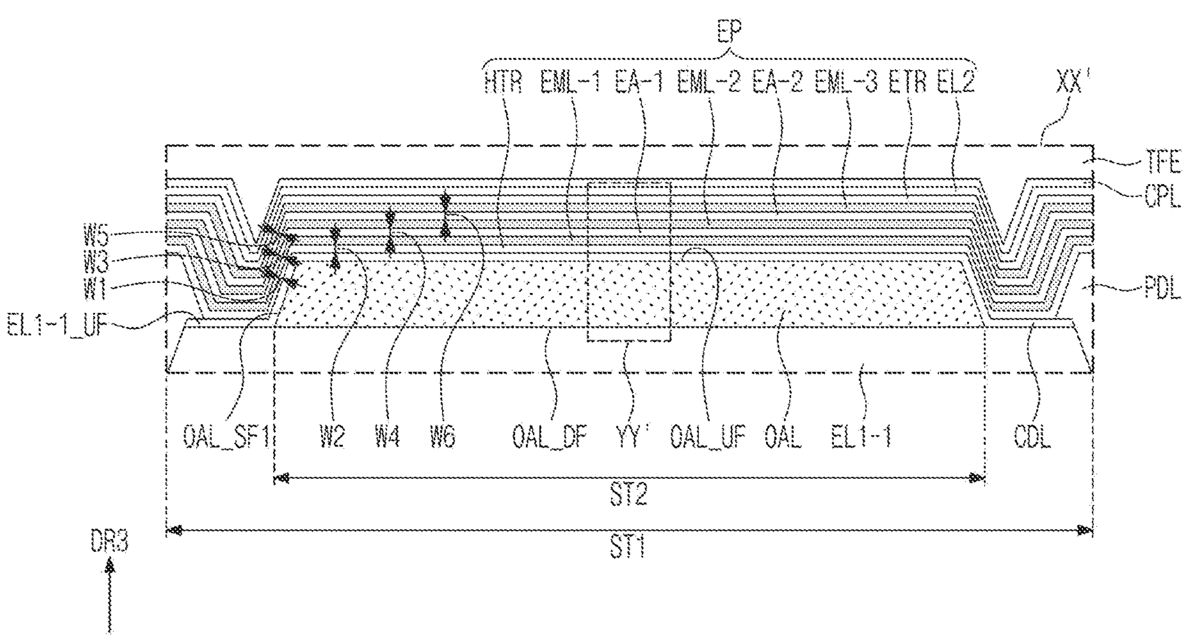
FIG. 4B is an enlarged cross-sectional view illustrating region XX' of FIG. 4A.

FIG. 4B is an enlarged cross-sectional view illustrating region XX' of FIG. 4A. Referring to FIG. 4B, the light-emitting portion EP may include a hole transport region HTR, a first light-emitting layer EML-1 located on the hole transport region HTR, a second light-emitting layer EML-2 located on the first light-emitting layer EML-1, a third light-emitting layer EML-3 located on the second light-emitting layer EML-2, a first light-emitting auxiliary portion EA-1 located between the first light-emitting layer EML-1 and the second light-emitting layer EML-2, and a second light-emitting auxiliary portion EA-2 located between the second light-emitting layer EML-2 and the third light-emitting layer EML-3.

In the first to third light-emitting elements ED-1, ED-2, and ED-3 (see FIG. 4A), the hole transport region HTR, the first light-emitting layer EML-1, the first light-emitting auxiliary portion EA-1, the second light-emitting layer EML-2, the second light-emitting auxiliary portion EA-2, and the third light-emitting layer EML-3 may be provided as a common layer. The display element layer DP-ED (see FIG. 4A) including the first light-emitting layer EML-1, a second light-emitting layer EML-2, and a third light-emitting layer EML-3, which generate light of different wavelength ranges, may emit white light.

Because it is possible to deposit the first to third light-emitting layers EML-1, EML-2, and EML-3, which are provided as common layers, without a mask, a pixel having a relatively small area may be formed. Therefore, in the display panel DP according to one or more embodiments of the present disclosure, many pixels having a rather small area may be located on a plane, thereby achieving high resolution.

The first electrodes EL1-1, EL1-2, and EL1-3 may be formed of a metal material, a metal alloy, or a conductive compound. The first electrodes EL1-1, EL1-2, and EL1-3 may be an anode or a cathode. However, the present disclosure is not limited thereto. In addition, the first electrodes EL1-1, EL1-2, and EL1-3 may be pixel electrodes. The first electrodes EL1-1, EL1-2, and EL1-3 may be transmissive electrodes, transflective electrodes, or reflective electrodes. The first electrodes EL1-1, EL1-2, and EL1-3 may contain at least one selected from the group consisting of Ag, Mg, Cu, Al, Pt, Pd, Au, Ni, Nd, Ir, Cr, Li, Ca, LiF, Mo, Ti, W, In, Sn, and Zn, a compound of two or more selected therefrom, a mixture of two or more selected therefrom, or an oxide thereof.

When the first electrodes EL1-1, EL1-2, and EL1-3 are transflective electrodes or reflective electrodes, the first electrodes EL1-1, EL1-2, and EL1-3 may contain Ag, Mg, Cu, Al, Pt, Pd, Au, Ni, Nd, Ir, Cr, Li, Ca, LiF/Ca (a stacked structure of LiF and Ca), LiF/Al (a stacked structure of LiF and Al), Mo, Ti, W, or a compound or mixture thereof (e.g., a mixture of Ag and Mg). Alternatively, the first electrodes EL1-1, EL1-2, and EL1-3 may have a multi-layered structure including a reflective or semi-transmissive film formed of the above materials, and a transparent conductive film formed of indium tin oxide (ITO), indium zinc oxide (IZO), zinc oxide (ZnO), indium tin zinc oxide (ITZO), or the like. For example, the first electrodes EL1-1, EL1-2, and EL1-3 may be reflective electrodes and may be formed of transparent conductive oxide (TCO). The first electrodes EL1-1, EL1-2, and EL1-3 may have a three-layer structure of ITO/Ag/ITO, but are not limited thereto.

Referring to FIG. 4B, the optical auxiliary layer OAL and the conductive layer CDL may be located between the first electrode EL1-1 and the hole transport region HTR. The optical auxiliary layer OAL may contain an inorganic material. The optical auxiliary layer OAL may be formed of an inorganic material including silicon. For example, the optical auxiliary layer OAL may contain at least one of silicon oxide, silicon oxynitride, or silicon nitride. Because the optical auxiliary layer OAL containing an inorganic material is located directly on the first electrode EL1-1, the conductive layer CDL may be located on the optical auxiliary layer OAL to provide electrical charge to the hole transport region HTR and the like located on the optical auxiliary layer OAL. At least a portion of the conductive layer CDL may come in contact with the first electrodes EL1-1, EL1-2, and EL1-3.

The conductive layer CDL may have conductivity. The conductive layer CDL may be formed of a metal material, a metal alloy, or a conductive compound. For example, the conductive layer CDL may be formed of transparent conductive oxide (TCO). The conductive layer CDL may be formed of a material that is the same as or different from that of the first electrodes EL1-1, EL1-2, and EL1-3. For example, the first electrodes EL1-1, EL1-2, and EL1-3 may be formed of a three-layer structure of ITO/Ag/ITO, and the conductive layer CDL may be formed of ITO. However, this is only an example, and the present disclosure is not limited thereto.

In the first light-emitting element ED-1 (see FIG. 4A), the hole transport region HTR may be provided on the conductive layer CDL, and in the second light-emitting element ED-2 (see FIG. 4A) and the third light-emitting element ED-3 (see FIG. 4A), the hole transport region HTR may be provided on the first electrodes EL1-2 and EL1-3. The hole transport region HTR may have a single-layered structure made of a single material, a single-layered structure made of a plurality of different materials, or a multi-layered structure having a plurality of layers made of a plurality of different materials. For example, the hole transport region HTR may contain a phthalocyanine compound, such as copper phthalocyanine, DNTPD(N1,N1'-([1,1'-biphenyl]-4,4'-diyl)bis(N1-phenyl-N4,N4-di-m-tolylbenzene-1,4-diamine)), m-MTDATA(4,4',4"-[tris(3-methylphenyl)phenylamino]triphenylamine), TDATA(4,4',4"-Tris(N,N-diphenylamino)triphenylamine), 2-TNATA(4,4',4"-tris[N(2-naphthyl)-N-phenylamino]-triphenylamine), PEDOT/PSS (Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonicacid), PANI/PSS (Polyaniline/Poly(4-styrenesulfonate)), NPB(N,N'-di(naphthalene-1-yl)-N,N'-diphenyl-benzidine), polyether ketone containing triphenylamine(TPAPEK), 4-Isopropyl-4'-methyldiphenyliodonium[Tetrakis(pentafluorophenyl)borate], HATCN(dipyrazino [2,3-f: 2', 3'-h] quinoxaline-2,3,6,7,10,11-hexacarbonitrile), etc.

In addition, the hole transport region HTR may contain a carbazole-based derivative, such as N-phenylcarbazole and polyvinylcarbazole, a fluorene-based derivative, TPD(N,N'-bis(3-methylphenyl)-N,N'-diphenyl-[1,1'-biphenyl]-4,4'-diamine), a triphenylamine-based derivative, such as TCTA (4,4',4"-tris(N-carbazolyl)triphenylamine), TAPC(4,4'-Cyclohexylidene bis[N,N-bis(4-methylphenyl) benzenamine]), HMTPD(4,4'-Bis[N,N'-(3-tolyl)amino]-3,3'-dimethylbiphenyl), CzSi(9-(4-tert-Butylphenyl)-3,6-bis(triphenylsilyl)-9H-carbazole), CCP(9-phenyl-9H-3,9'-bicarbazole), mCP(1,3-Bis (N-carbazolyl) benzene), or mDCP (1,3-bis (1,8-dimethyl-9H-carbazol-9-yl) benzene).

In addition to the aforementioned materials, the hole transport region HTR may further contain a charge generating material to improve conductivity. The charge generating material may be uniformly or non-uniformly dispersed within the hole transport region HTR. The charge generating material may be, for example, a p-dopant. The p-dopant may contain at least one of a metal halide compound, a quinone derivative, a metal oxide, or a compound containing a cyano group, but the present disclosure is not limited thereto. For example, the p-dopant may contain a metal halide compound, such as CuI and RbI, a quinone derivative, such as TCNQ (Tetracyanoquinodimethane) and F4-TCNQ (2,3,5,6-tetrafluoro-7,7'8,8-tetracyanoquinodimethane), a metal oxide, such as a tungsten oxide and a molybdenum oxide, and a compound containing a cyano group, such as HATCN (dipyrazino[2,3-f:2',3'-h]quinoxaline-2,3,6,7,10,11-hexacarbonitrile) and NDP9(4-[[2,3-bis[cyano-(4-cyano-2,3,5,6-tetrafluorophenyl)methylidene]cyclopropylidene]-cyanomethyl]-2,3,5,6-tetrafluorobenzonitrile), but the present disclosure is not limited thereto.

An electron transport region ETR may be provided on the second light-emitting auxiliary portion EA-2. The electron transport region ETR may have a single-layered structure made of a single material, a single-layered structure made of a plurality of different materials, or a multi-layered structure having a plurality of layers made of a plurality of different materials.

For example, the electron transport region ETR may contain an anthracene-based compound. Without being limited thereto, however, the electron transport region ETR may contain Alq3(Tris(8-hydroxyquinolinato)aluminum), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9, 10-dinaphthylanthracene, TPBi(1,3,5-Tri(1-phenyl-1H-benzo[d]imidazol-2-yl)benzene), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), Bebq2(berylliumbis(benzoquinolin-10-olate)), ADN(9,10-di(naphthalene-2-yl)anthracene), BmPyPhB(1,3-Bis [3,5-di (pyridin-3-yl) phenyl] benzene), and mixtures thereof.

In addition, the electron transport region ETR may contain a metal halide, such as LiF, NaCl, CsF, RbCl, RbI, CuI, and KI, a lanthanide metal, such as Yb, and a co-deposited material of the metal halide and the lanthanide metal. For example, the electron transport region ETR may contain KI:Yb, RbI:Yb, LiF:Yb, and the like as a co-deposited material. Meanwhile, in the electron transport region ETR, a metal oxide, such as Li2O or BaO, Liq (8-hydroxyl- Lithium quinolate), or the like may be used, but the present disclosure is not limited thereto. The electron transport region ETR may also be made of a mixture of an electron transport material and an insulating organo metal salt. The organo metal salt may be a material having an energy band gap of about 4 eV or more. Specifically, for example, the organo metal salt may include metal acetate, metal benzoate, metal acetoacetate, metal acetylacetonate or metal stearate.

In addition to the aforementioned materials, the electron transport region ETR may further include at least one of BCP(2,9-dimethyl-4,7-diphenyl-1,10-phenanthroline), TSPO1(diphenyl(4-(triphenylsilyl)phenyl)phosphine oxide), or Bphen(4,7-diphenyl-1,10-phenanthroline), but the present disclosure is not limited thereto.

The second electrode EL2 may be provided on the electron transport region ETR. The second electrode EL2 may be a common electrode. The second electrode EL2 may be a cathode or an anode, but the present disclosure is not limited thereto. For example, the first electrodes EL1-1, EL1-2, and EL1-3 may be anodes, and the second electrode EL2 may be a cathode. Unlike this, the first electrodes EL1-1, EL1-2, and EL1-3 may be cathodes, and the second electrode EL2 may be an anode.

The second electrode EL2 may contain at least one selected from the group consisting of Ag, Mg, Cu, Al, Pt, Pd, Au, Ni, Nd, Ir, Cr, Li, Ca, LiF, Mo, Ti, W, In, Sn, and Zn, a compound of two or more selected therefrom, a mixture of two or more selected therefrom, or an oxide thereof. The second electrode EL2 may be a transmissive electrode, a transflective electrode, or a reflective electrode. When the second electrode EL2 is a transmissive electrode, the second electrode EL2 may be made of a transparent metal oxide, for example, an indium tin oxide (ITO), an indium zinc oxide (IZO), a zinc oxide (ZnO), an indium tin zinc oxide (ITZO), or the like.

When the second electrode EL2 is a transflective electrode or a reflective electrode, the second electrode EL2 may contain Ag, Mg, Cu, Al, Pt, Pd, Au, Ni, Nd, Ir, Cr, Li, Ca, LiF/Ca, LiF/Al, Mo, Ti, Yb, W, or a compound or mixture containing them (e.g., AgMg, AgYb, or MgYb). Alternatively, the second electrode EL2 may have a multi-layered structure including: a reflective film or semi-transmissive film formed of an above-described material; and a transparent conductive film formed of an indium tin oxide (ITO), an indium zinc oxide (IZO), a zinc oxide (ZnO), an indium tin zinc oxide (ITZO), or the like. For example, the second electrode EL2 may contain an above-described metal material, a combination of two or more metal materials selected from among the above-described metal materials, an oxide of the above-described metal materials, or the like.

A capping layer CPL may be provided on the second electrode EL2. The capping layer CPL may include a plurality of layers or a single layer. The capping layer CPL may be an organic layer or an inorganic layer. For example, when the capping layer CPL contains an inorganic material, the inorganic material may include an alkali metal compound, such as LiF, an alkaline earth metal compound, such as $MgF_2$, SiON, $SiN_x$, $SiO_y$, and the like. Unlike this, when the capping layer CPL contains an organic material, the organic material may include α-NPD, NPB, TPD, m-MTDATA, $Alq_3$, CuPc, TPD15(N4, N4, N4', N4'-tetra (biphenyl-4-yl)biphenyl-4,4'-diamine), TCTA(4,4',4"-Tris(carbazol-9-yl)triphenylamine), an epoxy resin, or acrylate, such as methacrylate.

Referring to FIG. 4B, the conductive layer CDL may cover the optical auxiliary layer OAL. In one direction perpendicular to the thickness direction DR3, a length ST2 of the optical auxiliary layer OAL may be less than a length ST1 of the first electrode EL1-1. On a plane, the optical auxiliary layer OAL may be formed to have an area that is less than that of the first electrode EL1-1. Accordingly, the conductive layer CDL may come in contact with one region of an upper surface EL1-1_UF of the first electrode EL1-1, which does not overlap the optical auxiliary layer OAL. As described above, the conductive layer CDL in contact with the upper surface EL1-1_UF of the first electrode EL1-1 may provide an electric charge to the hole transport region HTR located on the conductive layer CDL.

The conductive layer CDL may cover the optical auxiliary layer OAL, and the hole transport region HTR may be provided as a common layer on the conductive layer CDL. Accordingly, in one direction perpendicular to the thickness direction DR3, the optical auxiliary layer OAL may be spaced apart from the hole transport region HTR with the conductive layer CDL interposed therebetween.

Referring to FIG. 4B, the optical auxiliary layer OAL may have a trapezoidal shape on a cross section. The optical auxiliary layer OAL may include a lower surface OAL_DF, a first side surface OAL_SF1 inclined with respect to the lower surface OAL_DF, and an upper surface OAL_UF above/opposite to the lower surface OAL_DF. The lower surface OAL_DF and the upper surface OAL_UF may be spaced apart from each other with the first side surface OAL_SF1 interposed therebetween. In the optical auxiliary layer OAL including the inclined first side surface OAL_SF1, an area of the upper surface OAL_UF may be less than that of the lower surface OAL_DF. The area of the upper surface OAL_UF and the area of the lower surface OAL_DF may be areas on a plane that is perpendicular to the thickness direction DR3.

For example, the optical auxiliary layer OAL may be formed through a photolithography process. A material for forming the optical auxiliary layer OAL may be directly deposited on the first electrode EL1-2, and the optical auxiliary layer OAL including the inclined first side surface OAL_SF1 may be formed through a dry etching process. In the dry etching process, the slope of the first side surface OAL_SF1 of the optical auxiliary layer OAL may be adjusted by adjusting an etching rate.

The widths of the hole transport region HTR, the first light-emitting auxiliary portion EA-1, and the second light-emitting auxiliary portion EA-2 at a portion overlapping the first side surface OAL_SF1 of the optical auxiliary layer OAL may be different from the widths thereof at a portion not overlapping the first side surface OAL_SF1 of the optical auxiliary layer OAL. The hole transport region HTR, the first light-emitting auxiliary portion EA-1, and the second light-emitting auxiliary portion EA-2 may be formed to have relatively small widths at the portion overlapping the first side surface OAL_SF1 of the optical auxiliary layer OAL. That is, in a region adjacent to the first side surface OAL_SF1 of the optical auxiliary layer OAL, the hole transport region HTR, the first light-emitting auxiliary portion EA-1, and the second light-emitting auxiliary portion EA-2 may have a trench shape. Accordingly, color mixing may be reduced or prevented in the display panel DP according to one or more embodiments of the present disclosure.

When the hole transport region, the first light-emitting auxiliary portion, and the second light-emitting auxiliary portion are formed to have uniform widths (e.g., in a comparative example), an electric charge is relatively suitably moved, resulting in lateral leakage. As lateral leakage occurs, color mixing occurs between adjacent light-emitting elements. Because the display panel DP according to one or more embodiments of the present disclosure includes the hole transport region HTR, the first light-emitting auxiliary portion EA-1, and the second light-emitting auxiliary portion EA-2 that have relatively small widths at the portion overlapping the inclined first side surface OAL_SF1 of the optical auxiliary layer OAL, color mixing may be reduced or prevented. Because resistance increases as the width becomes smaller, the movement of an electric charge between adjacent light-emitting elements ED-1 and ED-2 may be reduced, prevented, or minimized.

In one or more embodiments of the present disclosure, the hole transport region HTR may have a first width W1 in a direction that is perpendicular to the first side surface OAL_SF1 of the optical auxiliary layer OAL, and a second width W2 in a direction that is perpendicular to the upper surface OAL_UF of the optical auxiliary layer OAL. The second width W2 may be greater than the first width W1. As the first side surface OAL_SF1 of the optical auxiliary layer OAL is formed in an inclined shape, the hole transport region HTR located on the optical auxiliary layer OAL may be formed to have a small width at the portion overlapping the side surface OAL_SF1 of the optical auxiliary layer OAL. As an inclination angle of the side surface OAL_SF1 of the optical auxiliary layer OAL with respect to the lower surface OAL_DF thereof increases, the hole transport region HTR, which is deposited by using a linear deposition source, may be deposited so as to have a relatively small width at the portion overlapping the side surface OAL_SF1 of the hole transport region HTR.

The first light-emitting auxiliary portion EA-1 may have a third width W3 in a direction that is perpendicular to the side surface OAL_SF1 of the optical auxiliary layer OAL, and may have a fourth width W4 in a direction that is perpendicular to the upper surface OAL_UF of the optical auxiliary layer OAL. The fourth width W4 may be greater than the third width W3. As the side surface OAL_SF1 of the optical auxiliary layer OAL is inclined, the first light-emitting auxiliary portion EA-1 located on the optical auxiliary layer OAL may be deposited to have the relatively small width W3 at the position overlapping the side surface OAL_SF1 of the optical auxiliary layer OAL.

The second light-emitting auxiliary portion EA-2 may have a fifth width W5 in a direction that is perpendicular to the side surface OAL_SF1 of the optical auxiliary layer OAL, and may have a sixth width W6 in a direction that is perpendicular to the upper surface OAL_UF of the optical auxiliary layer OAL. The sixth width W6 may be greater than the fifth width W5. As the side surface OAL_SF1 of the optical auxiliary layer OAL is inclined, the second light-emitting auxiliary portion EA-2 located on the optical auxiliary layer OAL may be deposited to have the relatively small width W5 in the portion overlapping the side surface OAL_SF1 of the optical auxiliary layer OAL.

In FIG. 4B, the first light-emitting layer EML-1 may generate red light, the second light-emitting layer EML-2 may generate blue light, and the third light-emitting layer EML-3 may generate green light. Unlike this, the first light-emitting layer EML-1 may generate green light, the second light-emitting layer EML-2 may generate blue light, and the third light-emitting layer EML-3 may generate red light. Alternatively, the first light-emitting layer EML-1 may generate blue light, the second light-emitting layer EML-2 may generate red light, and the third light-emitting layer EML-3 may generate green light.

One or two light-emitting elements among the first to third light-emitting elements ED-1, ED-2, and ED-3 (see FIG. 4A) may include an optical auxiliary layer OAL and a conductive layer CDL, and the remaining light-emitting elements may omit an optical auxiliary layer and a conductive layer. Accordingly, at least one of the first, second, or third lights may have different order resonances. For example, the first light may have an m-th-order resonance, and the second light and the third light may have an m+a-th-order resonance. Here, "m" may be an integer of 2 to 5, and "a" may be an integer of 1 to 4.

For example, red light may have a second-order resonance, blue light may have a third-order resonance, and green light may have a third, fourth, or fifth-order resonance. In other embodiments, blue light may have a fifth-order resonance, green light may have a fourth-order resonance, and red light may have a second or third-order resonance. However, this is only an example, and the present disclosure is not limited thereto.

Equation 1 below shows a thickness of a thin film suitable for red light, green light, and blue light to have an n-th-order resonance. Here, "n" may be an integer of 2 to 6. The thickness of the thin film suitable for red light, green light, and blue light to have the n-th-order resonance may be referred to as a resonance distance of red light, green light, and blue light. The thin film may include components located between the first electrodes EL-1, EL1-2, and EL1-3 and the second electrode EL2. For example, the thin film may include a hole transport region HTR, a first light-emitting auxiliary portion EA-1, a second light-emitting auxiliary portion EA-2, and an electron transport region ETR. The thickness of the thin film may be a sum of two or more thicknesses among a thickness TH3 (see FIG. 7) of the hole transport region HTR, a thickness TN-1 (see FIG. 7) of the first light-emitting auxiliary portion EA-1, a thickness TN-2 (see FIG. 7) of the second light-emitting auxiliary portion EA-2, and a thickness TH2 (see FIG. 7) of the electron transport region ETR. In addition, the thin film may further include an optical auxiliary layer OAL located between the first electrodes EL-1, EL1-2, and EL1-3 and the second electrode EL2.

$$B2<G2<R2\approx B3<G3<B4<R3<G4\approx B5<R4\approx G5\approx B6 \quad \text{Equation 1}$$

In Equation 1, Bn indicates the thickness of the thin film suitable for blue light to have an n-th-order resonance. For example, B2 means the thickness of the thin film suitable for blue light to have a second-order resonance. Gn indicates the thickness of the thin film suitable for green light to have an n-th-order resonance. For example, G2 means the thickness of the thin film suitable for green light to have a second-order resonance. Rn indicates the thickness of the thin film suitable for red light to have an n-th-order resonance. For example, R2 means the thickness of the thin film suitable for red light to have a second-order resonance.

Referring to Equation 1, it can be seen that the thicknesses G2 and R2 of the thin films suitable for green light and red light to have a second-order resonance are greater than the thickness B2 of the thin film suitable for blue light to have a second-order resonance. It can be seen that the thickness R2 of the thin film suitable for red light to have a second-order resonance is similar to the thickness B3 of the thin film suitable for blue light to have a third-order resonance. It can be seen that the thickness R3 of the thin film suitable for red light to have a third-order resonance is less than the thickness G4 of the thin film suitable for green light to have a fourth-order resonance. It can be seen that the thickness G4 of the thin film suitable for green light to have a fourth-order resonance is similar to the thickness B5 of the thin film suitable for blue light to have a fifth-order resonance.

For example, the thickness of the hole transport region HTR, the first light-emitting auxiliary portion EA-1, the second light-emitting auxiliary portion EA-2, and the electron transport region ETR included in the first to third light-emitting elements ED-1, ED-2, and ED-3 may be provided as a thickness suitable for red light to have a second-order resonance and for blue light to have a third-order resonance, and an optical auxiliary layer OAL may be located in any one of the first to third light-emitting elements ED-1, ED-2, and ED-3 (see FIG. 4A), so that green light may have a third, fourth, or fifth-order resonance. Alternatively, the thickness of the hole transport region HTR, the first light-emitting auxiliary portion EA-1, the second light-emitting auxiliary portion EA-2, and the electron transport region ETR included in the first to third light-emitting elements ED-1, ED-2, and ED-3 may be provided as a thickness suitable for red light to have a second or third-order resonance, and an optical auxiliary layer OAL may be located in any two of the first to third light-emitting elements ED-1, ED-2, and ED-3 (see FIG. 5), so that green light may have a fourth-order resonance and blue light may have a fifth-order resonance. However, this is only an example, and the resonance order of each of red light, green light, and blue light and the light-emitting element including the optical auxiliary layer are not limited to any one embodiment. Referring to Equation 1 described above, the resonance order of each of red light, green light, and blue light and the light-emitting element including the optical auxiliary layer may be changed.

In the display panel DP including the optical auxiliary layer OAL according to one or more embodiments of the present disclosure, at least one of red light, green light, or blue light may have a different order resonance. The optical auxiliary layer OAL may compensate for a resonance distance of at least one of red light, green light, or blue light. Accordingly, the display panel DP according to one or more embodiments of the present disclosure may exhibit excellent display efficiency and improved display lifetime.

Table 1 below shows combinations 1 to 4, which are the combinations of the first to third lights generated by the first to third light-emitting layers EML-1, EML-2 and EML-3 illustrated in FIG. 4B and the colorants included in the first to third filters CF1, CF2, and CF3. However, this is only an example, and the present disclosure is not limited thereto.

TABLE 1

| | First filter | Second filter | Third filter |
|---|---|---|---|
| Combination 1 | Green colorant<br>First light-emitting layer<br>Red light | Red colorant<br>Second light-emitting layer<br>Blue light | Blue colorant<br>Third light-emitting layer<br>Green light |
| Combination 2 | Red colorant<br>First light-emitting layer<br>Green light | Green colorant<br>Second light-emitting layer<br>Blue light | Blue colorant<br>Third light-emitting layer<br>Red light |
| Combination 3 | Red colorant<br>First light-emitting layer<br>Blue light | Green colorant<br>Second light-emitting layer<br>Red light | Blue colorant<br>Third light-emitting layer<br>Green light |
| Combination 4 | Red colorant<br>First light-emitting layer<br>Red light | Green colorant<br>Second light-emitting layer<br>Blue light | Blue colorant<br>Third light-emitting layer<br>Green light |

Referring to Table 1, the first filter CF1 corresponding to the first light-emitting element ED-1 (see FIG. 4A) in which the optical auxiliary layer OAL is located may contain a green colorant or a red colorant. That is, in FIG. 4A, the optical auxiliary layer OAL may be provided to compensate for a resonance distance of green light or red light. For example, blue light may have a fifth-order resonance, green light may have a fourth-order resonance, and the optical auxiliary layer OAL may be provided for a fourth-order resonance of red light. Alternatively, red light may have a second-order resonance, blue light may have a third-order resonance, and the optical auxiliary layer OAL may be provided for a second, third, or fourth-order resonance of green light.

Figure 4C:
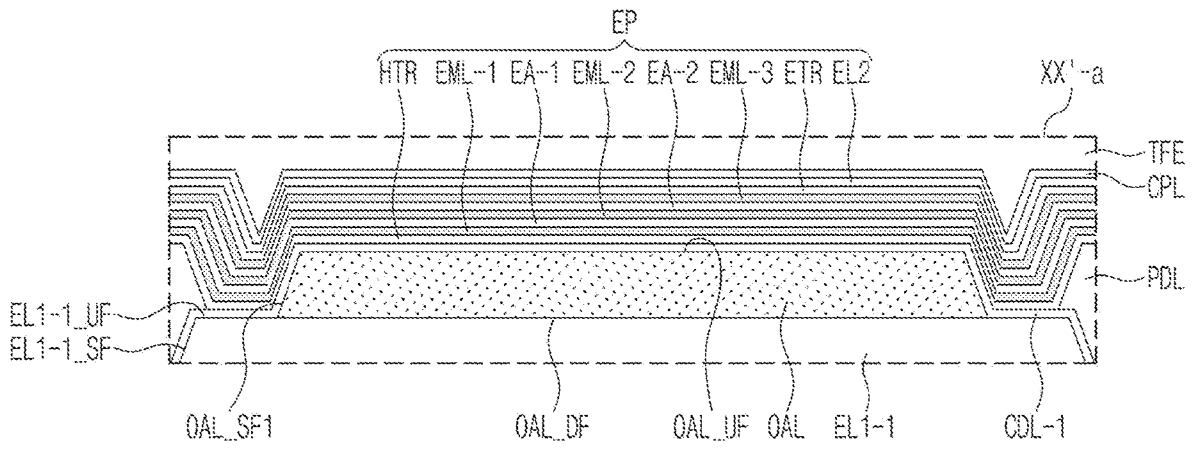
FIG. 4C is a cross-sectional view illustrating a portion of the display panel according to one or more embodiments of the present disclosure.

FIG. 4C is a cross-sectional view illustrating region XX'-a, which is one or more other embodiments of the region XX'. Compared to FIG. 4B, FIG. 4C is different in that a conductive layer CDL-1 comes in contact with a side surface EL1-1_SF of the first electrode EL1-1. In the description of FIG. 4C, contents overlapping those described above with reference to FIGS. 1 to 4B will not be described again, and differences will be mainly described.

Referring to FIG. 4C, the conductive layer CDL-1 may come in contact with a top surface EL1-1_UF of the first electrode EL1-1 and the side surface EL1-1_SF of the first electrode EL1-1. The conductive layer CDL-1 may cover the top surface EL1-1_UF of the first electrode EL1-1 and the side surface EL1-1_SF of the first electrode EL1-1.

Figure 5:
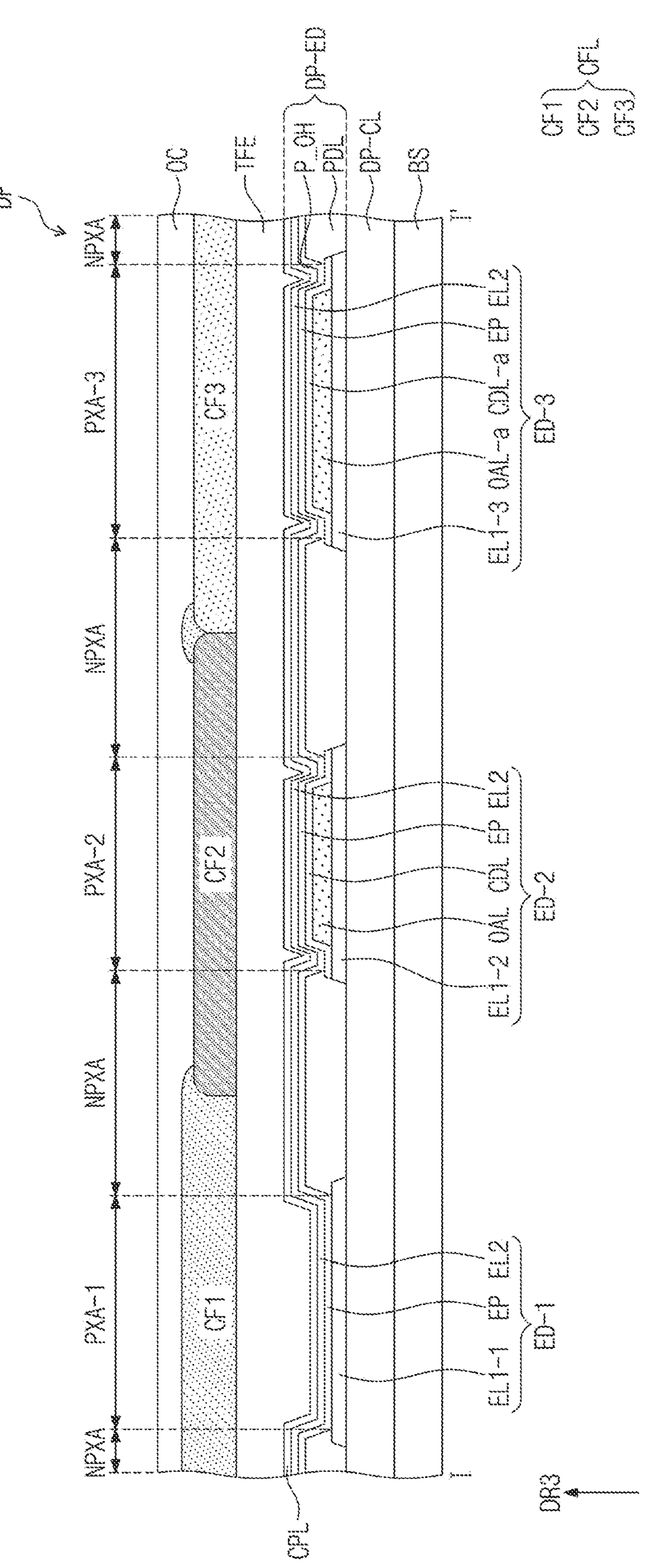
FIG. 5 is a cross-sectional view illustrating the display panel according to one or more embodiments of the present disclosure.

FIG. 5 illustrates one or more other embodiments of the display panel DP according to the present disclosure. Compared to FIG. 4A, FIG. 5 is different in that two light-emitting elements ED-2 and ED-3 include optical auxiliary layers OAL and OAL-a and conductive layers CDL and CDL-a. In the description of FIG. 5, contents overlapping those described above with reference to FIGS. 1 to 4C will not be described again, and differences will be mainly described.

Referring to FIG. 5, the second light-emitting element ED-2 and the third light-emitting element ED-3 may include optical auxiliary layers OAL and OAL-a and conductive layers CDL and CDL-a, and the first light-emitting element ED-1 may not include an optical auxiliary layer and a conductive layer. In FIG. 5, in the second light-emitting element ED-2 and the third light-emitting element ED-3 in which the optical auxiliary layers OAL and OAL-a are located, any two of the first to third lights, which may suitably have a similar resonance distance for an n-th-order resonance, may have a resonance.

The light-emitting portions EP of the first to third light-emitting elements ED-1, ED-2, and ED-3 illustrated in FIG. 5 may include the same configuration as the light-emitting portion EP described with reference to FIG. 4B. That is, the light-emitting portions EP of the first to third light-emitting elements ED-1, ED-2, and ED-3 illustrated in FIG. 5 may include the hole transport region HTR (see FIG. 4B), the first light-emitting layer EML-1 (see FIG. 4B), the first light-emitting auxiliary portion EA-1 (see FIG. 4B), the second light-emitting layer EML-2 (see FIG. 4B), the second light-emitting auxiliary portion EA-2 (see FIG. 4B), the third light-emitting layer EML-3 (see FIG. 4B), and the electron transport region ETR (see FIG. 4B), which are sequentially stacked.

In FIG. 5, the first filter CF1 may contain a red colorant, any one of the second and third filters CF2 and CF3 may contain a green colorant, and the remaining one may contain a blue colorant. The second filter CF2 and the third filter CF3 may be located to correspond to the second and third light-emitting elements ED-2 and ED-3 in which the optical auxiliary layers OAL and OAL-a are located. For example, the second filter CF2 may contain a green colorant, and the third filter CF3 may contain a blue colorant. Alternatively, the second filter CF2 may contain a blue colorant, and the third filter CF3 may contain a green colorant.

Table 2 below shows combinations 5 to 7 which are the combinations of the first to third lights generated by the first to third light-emitting layers EML-1, EML-2, and EML-3 included in the light-emitting portions EP of the first to third light-emitting elements ED-1, ED-2, and ED-3 illustrated in FIG. 5 and the colorants included in the first to third filters CF1, CF2, and CF3. However, this is only an example, and the present disclosure is not limited thereto.

TABLE 2

| | First filter | Second filter | Third filter |
|---|---|---|---|
| Combination 5 | Red colorant<br>First light-emitting layer<br>Red light | Green colorant<br>Second light-emitting layer<br>Blue light | Blue colorant<br>Third light-emitting layer<br>Green light |
| Combination 6 | Red colorant<br>First light-emitting layer<br>Green light | Green colorant<br>Second light-emitting layer<br>Red light | Blue colorant<br>Third light-emitting layer<br>Blue light |
| Combination 7 | Red colorant<br>First light-emitting layer<br>Blue light | Green colorant<br>Second light-emitting layer<br>Green light | Blue colorant<br>Third light-emitting layer<br>Red light |

Referring to Table 2, the second filter CF2 and the third filter CF3 corresponding to the second light-emitting element ED-2 and the third light-emitting element ED-3 in which the optical auxiliary layers OAL and OAL-a are located may contain a green colorant or a blue colorant. That is, the optical auxiliary layers OAL and OAL-a illustrated in FIG. 5 may be provided to compensate for the resonance distances of green light and blue light. For example, in the display panel DP illustrated in FIG. 5, green light may have a fourth-order resonance and blue light may have a fifth-order resonance.

Figure 6:
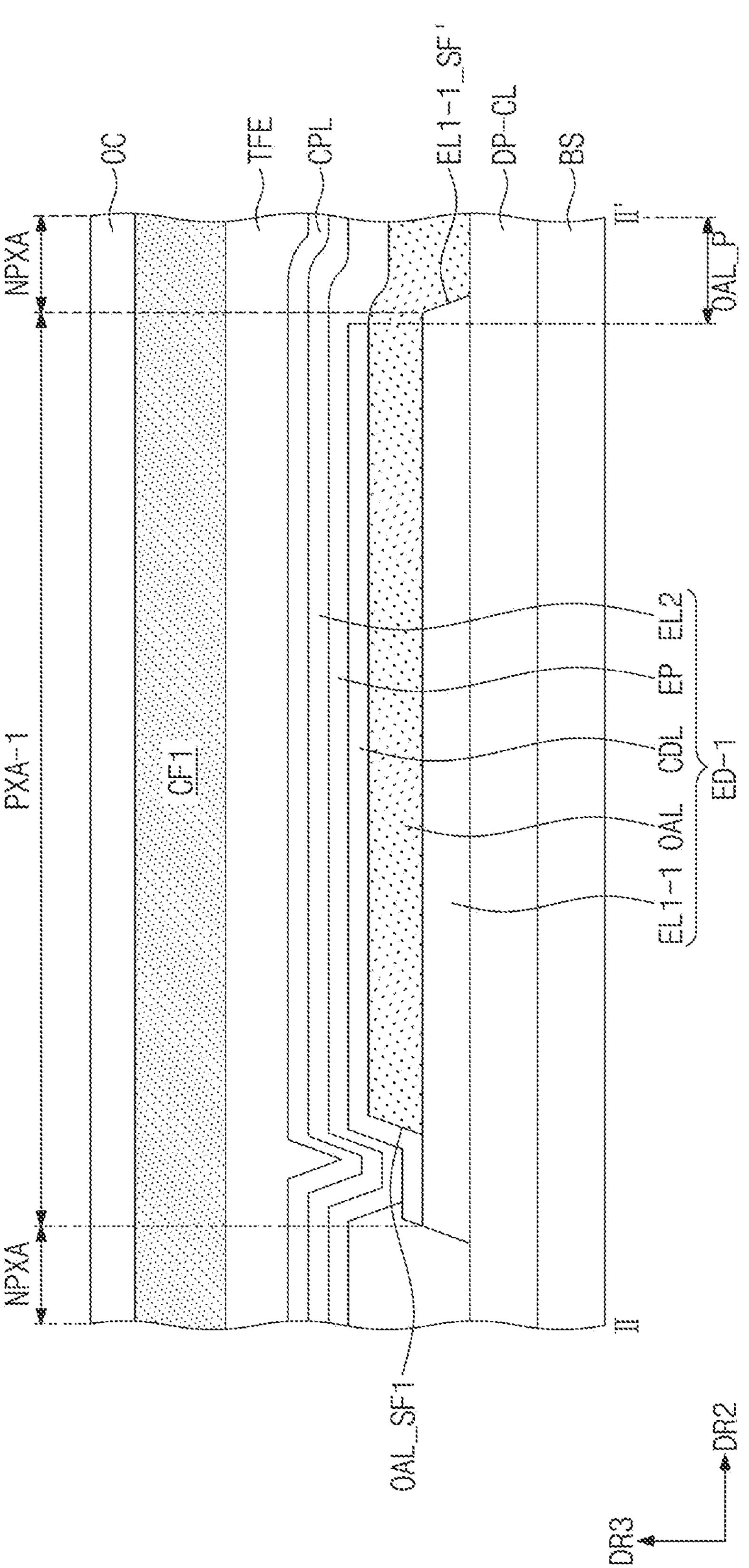
FIG. 6 is a cross-sectional view taken along the line II-II' of FIG. 3.

FIG. 6 is a cross-sectional view taken along the line II-II' of FIG. 3, and illustrates the first light-emitting element ED-1 corresponding to the first light-emitting region PXA-1. In the first light-emitting element ED-1, an optical auxiliary layer OAL is located, and one region OAL_P of the optical auxiliary layer OAL may be located to cover one side surface EL1-1_SF' of the first electrode EL1-1. In the optical auxiliary layer OAL, the one region OAL_P may have a relatively gentle slope compared to a first side surface OAL_SF1. The one region OAL_P of the optical auxiliary layer OAL may be defined as a region that does not overlap the conductive layer CDL. At least a portion of the one region OAL_P of the optical auxiliary layer OAL may come in contact with the circuit layer DP-CL.

On the one region OAL_P, a hole transport region HTR, a first light-emitting layer EML-1, a first light-emitting auxiliary portion EA-1, a second light-emitting layer EML-2, a second light-emitting auxiliary portion EA-2, a third light-emitting layer EML-3, an electron transport region ETR, and a second electrode EL2 may be sequentially stacked. The hole transport region HTR, the first light-emitting auxiliary portion EA-1, and the second light-emitting auxiliary portion EA-2 may be formed to have different respective widths at a portion overlapping the one region OAL_P of the optical auxiliary layer OAL as compared with a portion overlapping the first side surface OAL_SF1 of the optical auxiliary layer OAL. At a portion overlapping the one region OAL_P of the optical auxiliary layer OAL, the hole transport region HTR, the first light-emitting auxiliary portion EA-1, and the second light-emitting auxiliary portion EA-2 may be formed to be relatively thick. That is, at a portion overlapping the one region OAL_P of the optical auxiliary layer OAL, the hole transport region HTR, the first light-emitting auxiliary portion EA-1, and the second light-emitting auxiliary portion EA-2 may not have a trench shape. Accordingly, the likelihood of disconnection of the second electrode EL2 located on the second light-emitting auxiliary portion EA-2 may be reduced or prevented.

Referring to FIG. 3 again, a trench region TC may be a region in which a trench is formed on the first light-emitting region PXA-1 in which the line II-II' is illustrated, and which corresponds to the first light-emitting element ED-1 in which the optical auxiliary layer OAL is located. In the trench region TC, the hole transport region HTR, the first light-emitting auxiliary portion EA-1, and the second light-emitting auxiliary portion EA-2 may have relatively small widths, and the trench region TC may be a region in which the hole transport region HTR, the first light-emitting auxiliary portion EA-1, and the second light-emitting auxiliary portion EA-2 form a trench. The one region OAL_P (see FIG. 6) of the optical auxiliary layer OAL may correspond to a region excluding the trench region TC from an edge of the first light-emitting region PXA-1.

When the hole transport region, the first light-emitting auxiliary portion, and the second light-emitting auxiliary portion are all formed in a trench shape at the edge of the light-emitting region, the second electrode is formed to have a relatively small width. Because the resistance of the second electrode formed to have a small width increases, disconnection occurs between the light-emitting elements. According to one or more embodiments of the present disclosure, because the hole transport region HTR, the first light-emitting auxiliary portion EA-1, and the second light-emitting auxiliary portion EA-2 are not formed in a trench shape at a portion overlapping the one region OAL_P of the optical auxiliary layer OAL, the likelihood of disconnection of the second electrode EL2 located on the second light-emitting auxiliary portion EA-2 may be reduced or prevented. Accordingly, the display panel DP according to one or more embodiments of the present disclosure, which includes the optical auxiliary layer OAL and the conductive layer CDL, may exhibit excellent reliability.

Figure 7:
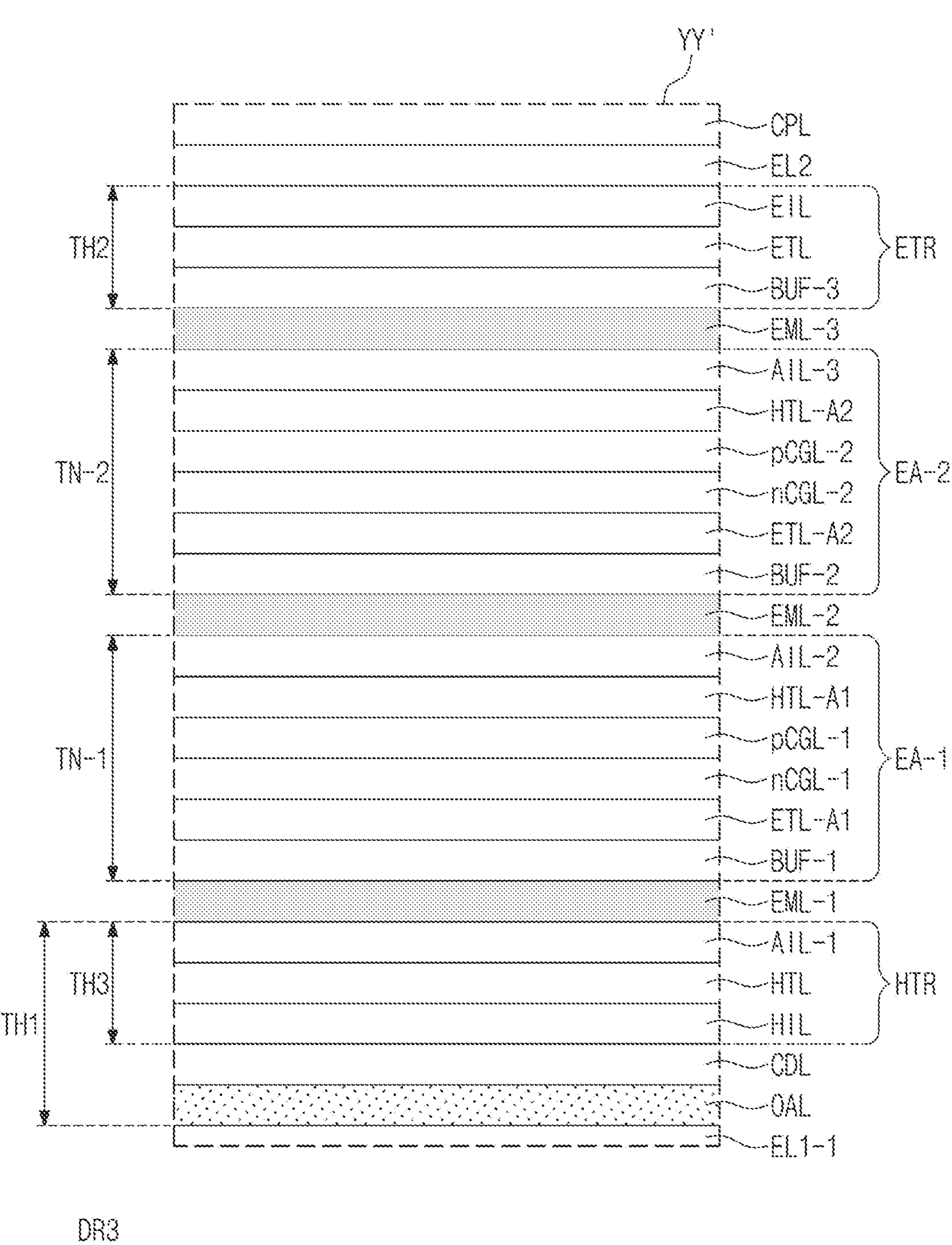
FIG. 7 is an enlarged cross-sectional view illustrating region YY' of FIG. 4B.

FIG. 7 is an enlarged view illustrating region YY' of FIG. 4B and may be a more detailed cross-sectional view of the first light-emitting element ED-1 (see FIG. 4A) including an optical auxiliary layer OAL. In addition, the stacked structure of FIG. 7 may be applied to the second light-emitting element ED-2 and the third light-emitting element ED-3 illustrated in FIG. 4B. The second light-emitting element ED-2 and the third light-emitting element ED-3 illustrated in FIG. 4B may include optical auxiliary layers OAL and OAL-a.

Referring to FIG. 7, the hole transport region HTR may include a hole injection layer HIL, a first hole transport layer HTL, and a first sub-hole control layer AIL-1, which are sequentially stacked. Unlike the illustration, at least one of the hole injection layer HIL, the first hole transport layer HTL, or the first sub-hole control layer AIL-1 may be omitted. The hole injection layer HIL, the first hole transport layer HTL, and the first sub-hole control layer AIL-1 may include the compounds of the hole transport region HTR described above.

The first sub-hole control layer AIL-1 may be located adjacent to the first light-emitting layer EML-1 that is configured to generate a first light. The first sub-hole control layer AIL-1 may be formed to have a highest occupied molecular orbital (HOMO) energy level and a lowest unoccupied molecular orbital (LUMO) energy level at which holes can suitably move. Accordingly, the light-emitting element ED-1 including the first sub-hole control layer AIL-1 may reduce or prevent an increase in driving voltage. In addition, the first sub-hole control layer AIL-1 may block electrons that move from the first light-emitting layer EML-1 to the hole transport region HTR. Accordingly, the lifetime of the display panel DP including the light-emitting element ED-1 including the first sub-hole control layer AIL-1 may be improved.

The electron transport region ETR located on the third light-emitting layer EML-3 may include a first buffer layer BUF-3, a first electron transport layer ETL, and an electron injection layer EIL, which are sequentially stacked. Unlike the illustration, at least one of the first buffer layer BUF-3, the first electron transport layer ETL, or the electron injection layer EIL may be omitted. The first buffer layer BUF-3, the first electron transport layer ETL, and the electron injection layer EIL may include the compounds of the electron transport region ETR described above. The first buffer layer BUF-3 may block holes that move from the third light-emitting layer EML-3 to the electron transport region ETR.

The first light-emitting auxiliary portion EA-1 located between the first light-emitting layer EML-1 and the second light-emitting layer EML-2 may include a first auxiliary buffer layer BUF-1, a second electron transport layer ETL-A1, a first charge generation layer nCGL-1, a second charge generation layer pCGL-1, a second hole transport layer HTL-A1, and a second sub-hole control layer AIL-2. The first charge generation layer nCGL-1 may be an n-type charge generation layer, and the second charge generation layer pCGL-1 may be a p-type charge generation layer. Unlike the illustration, at least one of the first auxiliary buffer layer BUF-1, the second electron transport layer ETL-A1, the first charge generation layer nCGL-1, the second charge generation layer pCGL-1, the second hole transport layer HTL-A1, or the second sub-hole control layer AIL-2 may be omitted.

The second sub-hole control layer AIL-2 may include a material that is different from that of the first sub-hole control layer AIL-1 described above. The second sub-hole control layer AIL-2 may contain a material that helps the second light-emitting layer EML-2 to generate a second light. The first sub-hole control layer AIL-1 may contain a material that helps the first light-emitting layer EML-1 to generate a first light. However, the present disclosure is not limited thereto, and the first sub-hole control layer AIL-1 and the second sub-hole control layer AIL-2 may contain a same material.

The second sub-hole control layer AIL-2 may be located adjacent to the second light-emitting layer EML-2 configured to generate a second light. The second sub-hole control layer AIL-2 may be formed to have a highest occupied molecular orbital (HOMO) energy level and a lowest unoccupied molecular orbital (LUMO) energy level at which holes can suitably move. Accordingly, the light-emitting element ED-1 including the second sub-hole control layer AIL-2 may reduce or prevent an increase in driving voltage. In addition, the second sub-hole control layer AIL-2 may block electrons that move from the second light-emitting layer EML-2 to the second hole transport layer HTL-A1. Therefore, the lifetime of the display panel DP, which includes the light-emitting element ED-1 including the second sub-hole control layer AIL-2, may be improved.

The second light-emitting auxiliary portion EA-2 located between the second light-emitting layer EML-2 and the third light-emitting layer EML-3 may include a second auxiliary buffer layer BUF-2, a third electron transport layer ETL-A2, a third charge generation layer nCGL-2, a fourth charge generation layer pCGL-2, a third hole transport layer HTL-A2, and a third sub-hole control layer AIL-3, which are sequentially stacked. The third charge generation layer nCGL-2 may be an n-type charge generation layer, and the fourth charge generation layer pCGL-2 may be a p-type charge generation layer. Unlike the illustration, at least one of the second auxiliary buffer layer BUF-2, the third electron transport layer ETL-A2, the third charge generation layer nCGL-2, the fourth charge generation layer pCGL-2, the third hole transport layer HTL-A2, or the third sub-hole control layer AIL-3 may be omitted.

The third sub-hole control layer AIL-3 may contain a material that is different from those of the first and second sub-hole control layers AIL-1 and AIL-2. The third sub-hole control layer AIL-3 may contain a material that helps the third light-emitting layer EML-3 to generate a third light. However, the present disclosure is not limited thereto, and the third sub-hole control layer AIL-3 may contain the same material as at least one of the first or second sub-hole control layers AIL-1 and AIL-2. For example, at least one of the first, second, or third sub-hole control layers AIL-1, AIL-2, or AIL-3 may contain a triphenyl amine-based compound.

The third sub-hole control layer AIL-3 may be located adjacent to the third light-emitting layer EML-3 configured to generate a third light. The third sub-hole control layer AIL-3 may be formed to have a highest occupied molecular orbital (HOMO) energy level and a lowest unoccupied molecular orbital (LUMO) energy level at which holes can suitably move. Accordingly, the light-emitting element ED-1 including the third sub-hole control layer AIL-3 may reduce or prevent an increase in driving voltage. In addition, the third sub-hole control layer AIL-3 may block electrons that move from the third light-emitting layer EML-3 to the third hole transport layer HTL-A2. Therefore, the display lifetime of the display panel DP, which includes the light-emitting element ED-1 including the third sub-hole control layer AIL-3, may be improved.

Referring to FIG. 7, the first light-emitting auxiliary portion EA-1 may have a first thickness TN-1, and the second light-emitting auxiliary portion EA-2 may have a second thickness TN-2. Each of the first and second thicknesses TN-1 and TN-2 may be about 500 Å to about 2500 Å. The first light-emitting auxiliary portion EA-1 and the second light-emitting auxiliary portion EA-2 respectively having a first thickness TN-1 and a second thickness TN-2 of about 500 Å to about 2500 Å may reduce or minimize an increase in driving voltage, and it is possible to suitably generate light in the first to third light-emitting layers EML-1, EML-2 and EML-3. A light-emitting auxiliary portion having a thickness of more than about 2500 Å increases the thickness of the display panel and raises the driving voltage. A light-emitting auxiliary portion having a thickness of less than about 500 Å is very thin and therefore, may not constitute layers containing a material suitable for generating light in the first to third light-emitting layers.

In the thickness direction DR3, a first distance TH1 from the first electrode EL1-1 to the first light-emitting layer EML-1 may be about 2000 Å or less. The first distance TH1 from the first electrode EL1-1 to the first light-emitting layer EML-1 may be the sum of all the thicknesses of components located between the first electrode EL-1 and the first light-emitting layer EML-1. For example, the first distance TH1 may be the sum of the thickness of the optical auxiliary layer OAL, the thickness of the conductive layer CDL, and the thickness TH3 of the hole transport region HTR. However, this is only an example, and the thicknesses of the components corresponding to the first distance TH1 are not limited thereto. When the first distance exceeds about 2000 Å, the driving voltage of the light-emitting element rises. In one or more embodiments of the present disclosure, the light-emitting element ED-1 having a first distance TH1 of about 2000 Å or less from the first electrode EL1-1 to the first light-emitting layer EML-1 may reduce or prevent an increase in driving voltage, and may improve the display lifetime and display efficiency of the display panel DP including the light-emitting element ED-1 (see FIG. 4A).

In the thickness direction DR3, a second distance TH2 from the third light-emitting layer EML-3 to the second electrode EL2 may be about 600 Å or less. The second distance TH2 from the third light-emitting layer EML-3 to the second electrode EL2 may be the sum of the thicknesses of components located between the third light-emitting layer EML-3 and the second electrode EL2. For example, the second distance TH2 may be the same as the thickness of the electron transport region ETR. However, this is only an example, and the thicknesses of the components corresponding to the second distance TH2 are not limited thereto. When the second distance exceeds about 600 Å, the driving voltage of the light-emitting element rises. In one or more embodiments of the present disclosure, the light-emitting element ED-1 (see FIG. 4A) having a second distance TH2 of about 600 Å or less from the third light-emitting layer EML-3 to the second electrode EL2 may reduce or prevent an increase in driving voltage and improve the display lifetime and display efficiency of the display panel DP including the light-emitting element ED-1 (see FIG. 4A).

Figure 8:
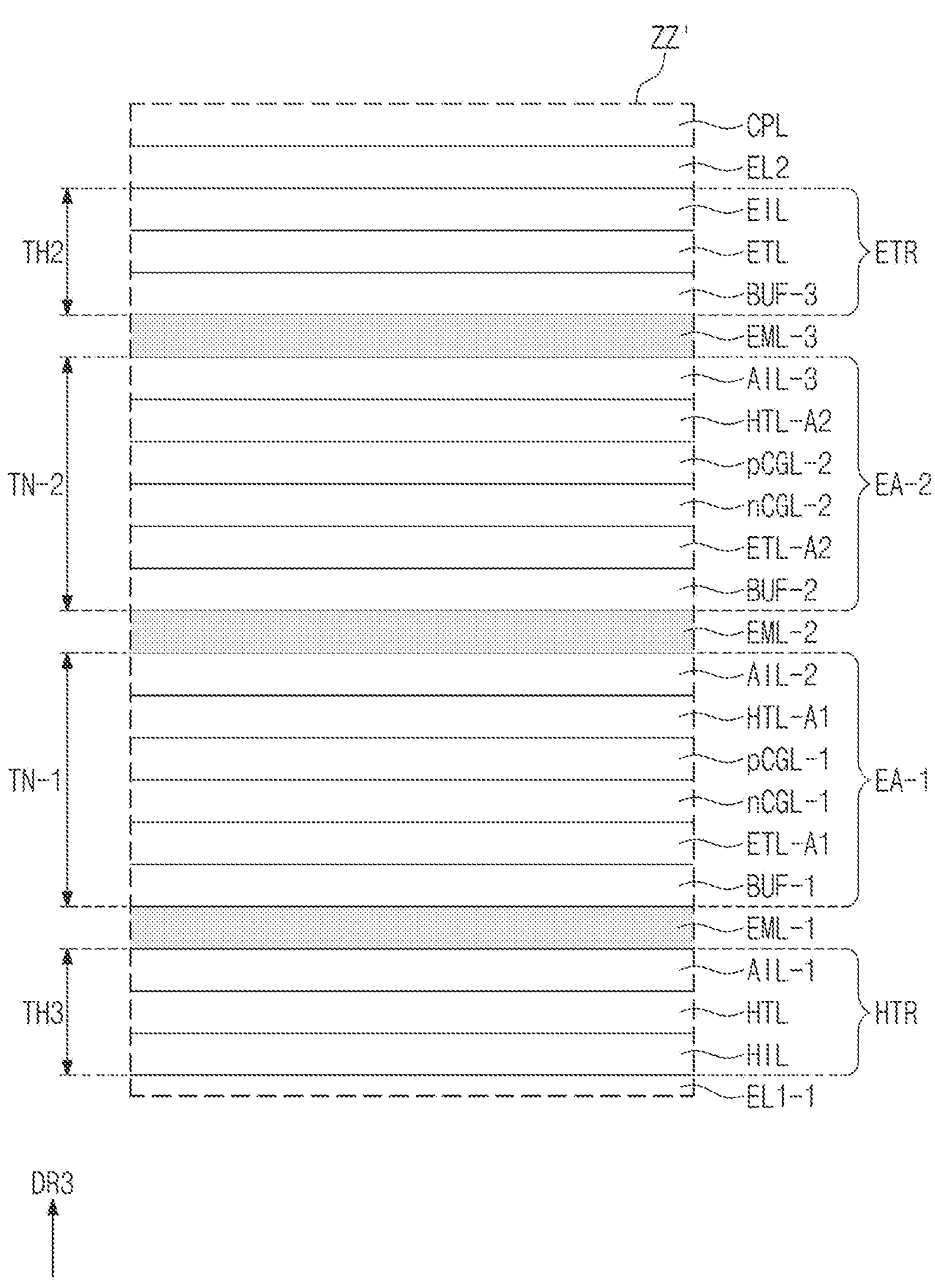
FIG. 8 is an enlarged cross-sectional view illustrating region ZZ' of FIG. 4A.

FIG. 8 is an enlarged view illustrating region ZZ' of FIG. 4A, and may be a more detailed cross-sectional view of the second light-emitting element ED-2 (see FIG. 4A) that does not include an optical auxiliary layer and a conductive layer. In addition, the stacked structure of FIG. 8 may be applied to the third light-emitting element ED-3 illustrated in FIG. 4A and the first light-emitting element ED-1 illustrated in FIG. 5. FIGS. 7 and 8 differ from each other only as to whether or not the optical auxiliary layer and the conductive layer are included (e.g., whether or not the optical auxiliary layer and the conductive layer are omitted), and the hole transport region HTR, the first light-emitting auxiliary portion EA-1, and the second light-emitting auxiliary portion EA-2 are illustrated to include a same stacked structure.

In the first light-emitting element ED-1 illustrated in FIG. 8, the first distance from the first electrode EL1-1 to the first light-emitting layer EML-1 may be equal to the thickness TH3 of the hole transport region HTR. In the light-emitting element ED-2 in which an optical auxiliary layer and a conductive layer are not located on the first electrode EL1-2 (e.g., in which the optical auxiliary layer and the conductive layer are omitted), the first distance may be equal to the thickness TH3 of the hole transport region HTR. Accordingly, the thickness TH3 of the hole transport region HTR illustrated in FIG. 8 may be about 2000 Å or less.

Figure 9:
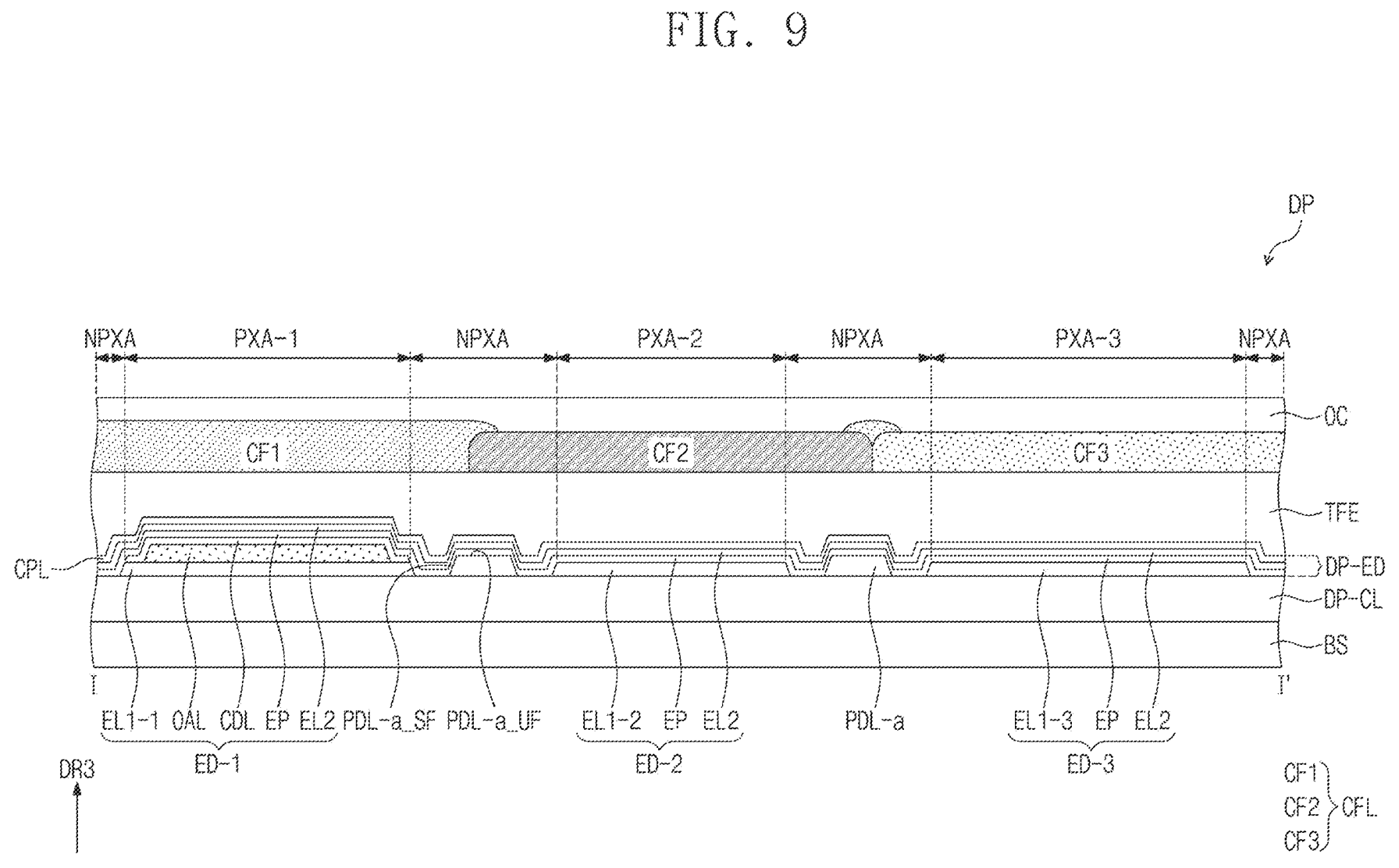

FIG. 9 is a cross-sectional view illustrating one or more other embodiments of the present disclosure, in which a pixel-defining film PDL-a is illustrated to be spaced apart from the first electrodes EL1-1, EL1-2, and EL1-3. Compared to the cross-sectional views of FIGS. 4A and 5, FIG. 9 differs in that the pixel-defining film PDL-a is spaced apart from the first electrodes EL1-1, EL1-2, and EL1-3. In the description of FIG. 9, contents overlapping those described with reference to FIGS. 1 to 8 might not be described again, and differences will be mainly described.

Referring to FIG. 9, in one direction perpendicular to the thickness direction DR3, the pixel-defining film PDL-a and the first electrodes EL1-1, EL1-2, and EL1-3 may be spaced apart from each other with the light-emitting portion EP interposed therebetween (e.g., in plan view). The light-emitting portion EP illustrated in FIG. 9 may include the same configuration as the light-emitting portion EP described with reference to FIG. 4B. That is, the light-emitting portion EP illustrated in FIG. 9 may include a hole transport region HTR (see FIG. 4B), a first light-emitting layer EML-1 (see FIG. 4B), a first light-emitting auxiliary portion EA-1 (see FIG. 4B), a second light-emitting layer EML-2 (see FIG. 4B), a second light-emitting auxiliary portion EA-2 (see FIG. 4B), a third light-emitting layer EML-3 (see FIG. 4B), and an electron transport region ETR (see FIG. 4B), which are sequentially stacked.

Accordingly, the hole transport region HTR (see FIG. 4B) of the light-emitting portion EP illustrated in FIG. 9 may be located on the circuit layer DP-CL at a portion that does not overlap the pixel-defining film PDL-a and the first electrodes EL1-1, EL1-2, and EL1-3. The hole transport region HTR may come in contact with the circuit layer DP-CL at a portion that does not overlap the pixel-defining film PDL-a and the first electrodes EL1-1, EL1-2, and EL1-3 (e.g., at a portion that is separated from the pixel-defining film PDL-a and the first electrodes EL1-1, EL1-2, and EL1-3 in plan view).

The pixel-defining film PDL-a spaced apart from the first electrodes EL1-1, EL1-2, and EL1-3 may be formed of the same material as the optical auxiliary layer OAL. For example, the pixel-defining film PDL-a illustrated in FIG. 9 may contain a silicon-based inorganic material. For example, the pixel-defining film PDL-a illustrated in FIG. 9 may contain at least one of silicon nitrite, silicon oxynitrite, or silicon oxide.

The pixel-defining film PDL-a may include an upper surface PDL-a_UF spaced apart from the circuit layer DP-CL in the thickness direction DR3, and a side surface PDL-a_SF inclined with respect to the circuit layer DP-CL. As described above, in one or more embodiments of the present disclosure, the hole transport region HTR (see FIG. 4B), the first light-emitting auxiliary portion EA-1 (see FIG. 4B), and the second light-emitting auxiliary portion EA-2 (see FIG. 4B) may be formed to have a relatively small width at a portion overlapping the inclined side surface PDL-a_SF of the pixel-defining film PDL-a. Compared to the display element layer DP-ED illustrated in FIGS. 4A and 5, the display element layer DP-ED illustrated in FIG. 9 may have more trench shapes formed therein. Accordingly, color mixing due to side leakage between adjacent light-emitting elements ED-1, ED-2, and ED-3 may be reduced or prevented.

Table 3 below shows driving voltages, CIE color coordinates, and light efficiencies of the first to third light-emitting elements in the display panels of Comparative Example and Experimental Example. The display panels of Comparative Example and Experimental Example include a color filter layer on the first to third light-emitting elements, and a first light, a second light, or a third light is emitted through the color filter layer. A first filter located on the first light-emitting element emits the first light, a second filter located on the second light-emitting element emits the second light, and a third filter located on the third light-emitting element emits the third light. The first to third lights are respectively blue light, red light, or green light.

In Table 3, a first driving voltage was measured in the light-emitting element corresponding to the filter from which blue light was emitted among the first to third light-emitting elements. A second driving voltage was measured in the light-emitting element corresponding to the filter from which green light was emitted among the first to third light-emitting elements. A third driving voltage was measured in the light-emitting element corresponding to the filter from which red light was emitted among the first to third light-emitting elements. The display panel of Comparative Example includes first to third light-emitting elements in which two light-emitting layers are stacked, and the display panel of Experimental Example includes first to third light-emitting elements in which three light-emitting layers are stacked. The display panel of Experimental Example includes a configuration according to Combination 1 of Table 1.

TABLE 3

| | First driving voltage | Blue light, color coordinate x | Blue light, color coordinate y | Blue light efficiency |
|---|---|---|---|---|
| Comparative Example | 8.5 | 0.142 | 0.042 | 3.3 |
| Experimental Example | 10.3 | 0.147 | 0.030 | 4.7 |
| | **Second driving voltage** | **Green light, color coordinate x** | **Green light, color coordinate y** | **Green light efficiency** |
| Comparative Example | 9.2 | 0.316 | 0.653 | 26.1 |
| Experimental Example | 10.3 | 0.183 | 0.772 | 95.4 |
| | **Third driving voltage** | **Red light, color coordinate x** | **Red light, color coordinate y** | **Red light efficiency** |
| Comparative example | 9.8 | 0.660 | 0.327 | 6.7 |
| Experimental Example | 9.8 | 0.690 | 0.305 | 63.5 |
| | **White light efficiency** | | | |
| Comparative Example | 13.4 | | | |
| Experimental Example | 48.7 | | | |

Referring to Table 3, it can be seen that Experimental Example is excellent in blue light efficiency, green light efficiency, red light efficiency, and white light efficiency, as compared to Comparative Example. Compared to Comparative Example, it can be seen that the blue light efficiency of Experimental Example increased by about 142.4%, the green light efficiency thereof increased by about 365.5%, and the red light efficiency thereof increased by about 947.8%. In addition, it can be seen that the white light efficiency of Experimental Example increased by about 363.4%, compared to Comparative Example. Accordingly, in one or more embodiments of the present disclosure, it is determined that the display panel including the optical auxiliary layer and the first to third light-emitting layers configured to generate light of different wavelength ranges exhibits excellent light efficiency.

Figure 10:
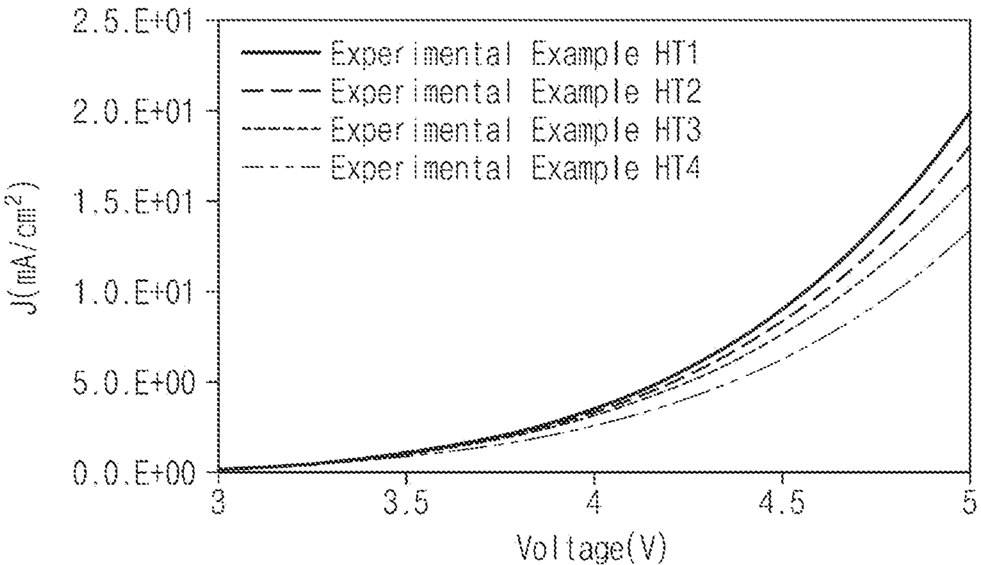
FIG. 10 shows current densities according to driving voltages in experimental examples.

FIG. 10 shows current densities according to driving voltages in the light-emitting elements of experimental examples. In FIG. 10, the light-emitting elements of Experimental Examples HT1 to HT4 have hole transport layers, which are located between the first electrode and the light-emitting layer adjacent to the first electrode and which have different thicknesses, and also have three light-emitting layers, while the first to third lights have a second-order resonance. The light-emitting element of Experimental Example HT1 has a hole transport layer with a thickness of about 500 Å, and the light-emitting element of Experimental Example HT2 has a hole transport layer with a thickness of about 700 Å. The light-emitting element of Experimental Example HT3 has a hole transport layer with a thickness of about 900 Å, and the light-emitting element of Experimental Example HT4 has a hole transport layer with a thickness of about 1100 Å.

Referring to FIG. 10, it can be seen that Experimental Example HT4 exhibits the highest driving voltage at a point at which the current density is about 1.0.E+01 mA/cm$^2$. It can be seen that the light-emitting element of Experimental Example HT4 including a relatively thickest hole transport layer may use the highest driving voltage. In addition, it can be seen that the light-emitting element of Experimental Example HT1 including a relatively thinnest hole transport layer may use the lowest driving voltage.

Figure 11:
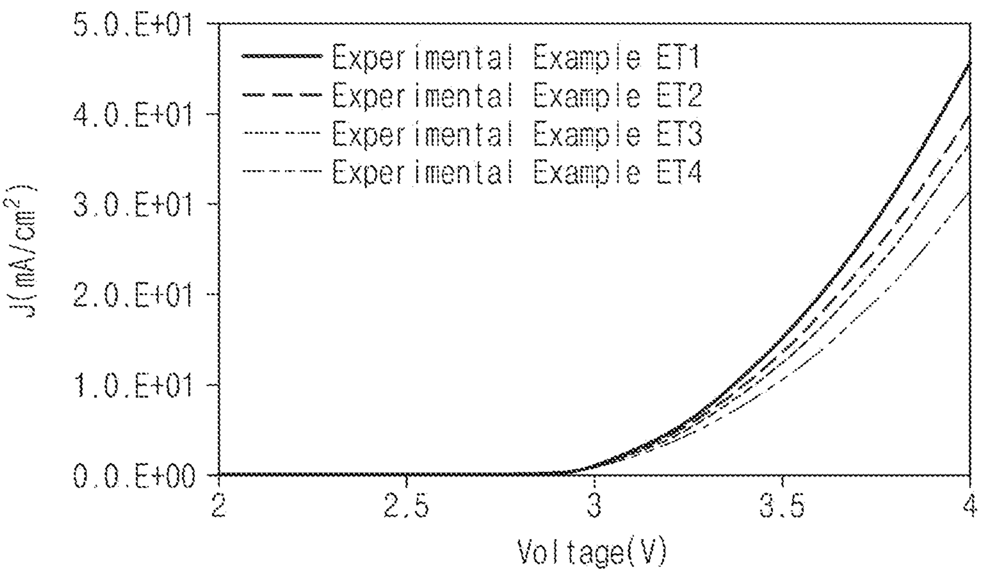
FIG. 11 shows current densities according to driving voltages in experimental examples.

FIG. 11 shows current densities according to driving voltages in the light-emitting elements of experimental examples. In FIG. 11, the light-emitting elements of Experimental Examples ET1 to ET4 have electron transport layers, which are located between the second electrode and the light-emitting layer adjacent to the second electrode and which have different thicknesses, and include three light-emitting layers, and the first to third lights have a second-order resonance.

The light-emitting element of Experimental Example ET1 has an electron transport layer with a thickness of about 250 Å, and the light-emitting element of Experimental Example ET2 has an electron transport layer with a thickness of about 280 Å. The light-emitting element of Experimental Example ET3 has an electron transport layer with a thickness of about 310 Å, and the light-emitting element of Experimental Example ET4 has an electron transport layer with a thickness of about 340 Å.

Referring to FIG. 11, it can be seen that Experimental Example ET4 exhibits the highest driving voltage at a point at which the current density is about 2.0.E+01 mA/cm$^2$. It can be seen that the light-emitting element of Experimental Example ET4 including a relatively thickest electron transport layer may use the highest driving voltage. In addition, it can be seen that the light-emitting element of Experimental Example ET1 including a relatively thinnest electron transport layer may use the lowest driving voltage. Accordingly, in one or more embodiments of the present disclosure, it is determined that the display panel, which includes a light-emitting element in which a first distance between the first electrode and the first light-emitting layer is about 2000 Å or less, exhibits a suitable level of increase in driving voltage. In addition, it is determined that the display panel, which includes a light-emitting element in which a second distance between the third light-emitting layer and the second electrode is about 600 Å or less, exhibits a suitable level of increase in driving voltage.

An electronic apparatus according to one or more embodiments of the present disclosure may include a display panel according to one or more embodiments of the present disclosure. The display panel according to one or more embodiments of the present disclosure may include a first light-emitting element and a second light-emitting element in a display element layer. Each of the first light-emitting element and the second light-emitting element may include a first electrode, a hole transport region, a first light-emitting layer, a first light-emitting auxiliary portion, a second light-emitting layer, a second light-emitting auxiliary portion, a third light-emitting layer, an electron transport region, and a second electrode which are sequentially stacked. The first to third light-emitting layers may respectively generate first to third lights that are lights of respective wavelength ranges. The first light-emitting element may include an optical auxiliary layer and a conductive layer sequentially stacked between the first electrode and the hole transport region. The optical auxiliary layer may be provided to compensate for a resonance distance of at least one of the first, second, or third lights. In one or more embodiments of the present disclosure, the optical auxiliary layer may include an inclined side surface, and the hole transport region, the first light-emitting auxiliary portion, and the second light-emitting auxiliary portion may be formed to have a relatively small width at a portion overlapping the inclined side surface. Accordingly, color mixing between adjacent light-emitting elements may be reduced or prevented. In addition, at least one of the first, second, or third lights may have a resonance of a different order. The display panel according to one or more embodiments of the present disclosure may exhibit excellent display efficiency and improved display lifetime.

A display panel and an electronic apparatus including the display panel according to one or more embodiments of the present disclosure may exhibit excellent display efficiency and improved display lifetime by including an optical auxiliary layer including an inclined side surface.

Although the above has been described with reference to preferred embodiments of the present disclosure, those skilled in the art or those of ordinary skill in the art will understand that various modifications and changes can be made to the present disclosure within the scope that does not depart from the spirit and technical field of the present disclosure described in the claims to be described later.

Accordingly, the technical scope of the present disclosure should not be limited to the content described in the detailed description of the specification, but should be determined by the claims described hereinafter, with functional equivalents thereof to be included therein.

What is claimed is:

1. A display panel comprising:
a circuit layer; and
a display element layer above the circuit layer, and comprising a first light-emitting element, a second light-emitting element, and a pixel-defining film arranged in a direction perpendicular to a thickness direction, the first light-emitting element and the second light-emitting element comprising:
a first electrode;
a hole transport region above the first electrode;
a first light-emitting layer above the hole transport region, and configured to generate a first light;
a second light-emitting layer above the first light-emitting layer, and configured to generate a second light that is different from the first light;
a third light-emitting layer above the second light-emitting layer, and configured to generate a third light that is different from the first light and the second light;
an electron transport region above the third light-emitting layer;
a second electrode above the electron transport region;
a first light-emitting auxiliary portion between the first light-emitting layer and the second light-emitting layer; and
a second light-emitting auxiliary portion between the second light-emitting layer and the third light-emitting layer,
wherein the first light-emitting element comprises an optical auxiliary layer and a conductive layer sequentially stacked between the first electrode and the hole transport region,
wherein the second light-emitting element omits the optical auxiliary layer and the conductive layer,
wherein the optical auxiliary layer is spaced from a portion of the hole transport region in the direction perpendicular to the thickness direction with the conductive layer interposed therebetween, and
wherein the optical auxiliary layer comprises a region covering a side surface of the first electrode and spaced apart from the conductive layer in a plan view.

2. The display panel of claim 1, wherein the optical auxiliary layer comprises:
a lower surface;
a first side surface inclined with respect to the lower surface; and
an upper surface spaced apart from the lower surface in the thickness direction.

3. The display panel of claim 2, wherein the hole transport region has:
a first width in a direction perpendicular to the first side surface of the optical auxiliary layer; and
a second width in the thickness direction that is greater than the first width.

4. The display panel of claim 2, wherein the first light-emitting auxiliary portion has:
a third width in a direction perpendicular to the first side surface of the optical auxiliary layer; and a fourth width in the thickness direction that is greater than the third width.

5. The display panel of claim 2, wherein the second light-emitting auxiliary portion has:

a fifth width in a direction perpendicular to the first side surface of the optical auxiliary layer; and a sixth width in the thickness direction that is greater than the fifth width.

6. The display panel of claim 1, wherein the optical auxiliary layer comprises at least one of silicon oxide, silicon oxynitride, or silicon nitride.

7. The display panel of claim 1, wherein the conductive layer covers the optical auxiliary layer, and contacts an upper surface of the first electrode.

8. The display panel of claim 7, wherein the conductive layer contacts the side surface of the first electrode.

9. The display panel of claim 1, wherein a first thickness of the first light-emitting auxiliary portion is about 500 Å to about 2500 Å, and wherein a second thickness of the second light-emitting auxiliary portion is about 500 Å to about 2500 Å.

10. The display panel of claim 1, wherein a first distance from the first electrode to the first light-emitting layer in the thickness direction is about 2000 Å or less.

11. The display panel of claim 1, wherein a second distance from the third light-emitting layer to the second electrode in the thickness direction is about 600 Å or less.

12. The display panel of claim 1, wherein a first one of the first light, the second light, and the third light has an m-th-order resonance, and wherein a second one of the first light, the second light, and the third light has an m+a-th-order resonance, "m" being an integer of 2 to 5, and "a" being an integer of 1 to 4.

13. The display panel of claim 1, wherein the pixel-defining film is spaced from the first electrode in the direction perpendicular to the thickness direction, and comprises a same material as the optical auxiliary layer.

14. The display panel of claim 13, wherein the hole transport region contacts the circuit layer at a portion that is spaced apart from the first electrode and the pixel-defining film.

15. The display panel of claim 1, further comprising a color filter layer above the display element layer, and comprising a first filter corresponding to the first light-emitting element, and a second filter corresponding to the second light-emitting element, wherein the first filter comprises a green colorant or a blue colorant, and the second filter comprises a red colorant, or wherein the first filter comprises the red colorant, and the second filter comprises the green colorant or the blue colorant.

16. The display panel of claim 1, wherein the first light comprises red light, wherein the second light comprises blue light, and wherein the third light comprises green light.

17. The display panel of claim 1, wherein the first light comprises green light, wherein a first one of the second light and the third light comprises red light, and wherein a second one of the second light and the third light comprises blue light.

18. The display panel of claim 1, wherein the first light comprises blue light, wherein a first one of the second light and the third light comprises red light, and wherein a second one of the second light and the third light comprises green light.

19. An electronic apparatus comprising:

a display panel; and a lens unit opposite to the display panel, wherein the display panel comprises:

a circuit layer; and a display element layer above the circuit layer, and comprising a first light-emitting element, a second light-emitting element, and a pixel-defining film arranged in a direction perpendicular to a thickness direction, wherein the first light-emitting element and the second light-emitting element comprise:

a first electrode;

a hole transport region above the first electrode;

a first light-emitting layer above the hole transport region, and configured to generate a first light;

a second light-emitting layer above the first light-emitting layer, and configured to generate a second light different from the first light;

a third light-emitting layer above the second light-emitting layer, and configured to generate a third light different from the first light and the second light;

a second electrode above the third light-emitting layer;

a first light-emitting auxiliary portion between the first light-emitting layer and the second light-emitting layer; and a second light-emitting auxiliary portion between the second light-emitting layer and the third light-emitting layer, wherein the first light-emitting element comprises an optical auxiliary layer and a conductive layer sequentially stacked between the first electrode and the hole transport region, wherein the second light-emitting element omits the optical auxiliary layer and the conductive layer, wherein the optical auxiliary layer is spaced from the hole transport region in the direction perpendicular to the thickness direction with the conductive layer interposed therebetween, and wherein the optical auxiliary layer comprises a region covering a side surface of the first electrode and spaced apart from the conductive layer in a plan view.

* * * * *